United States Patent
Lee et al.

(10) Patent No.: US 12,366,684 B2
(45) Date of Patent: Jul. 22, 2025

(54) TILED DISPLAY DEVICE

(71) Applicant: Samsung Display Co., Ltd., Yongin-si (KR)

(72) Inventors: Won Jun Lee, Seoul (KR); Se Hyun Lee, Hwaseong-si (KR); Hae Chan Park, Seoul (KR); Young Su Lim, Hwaseong-si (KR); Jin Joo Ha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 740 days.

(21) Appl. No.: 17/445,384

(22) Filed: Aug. 18, 2021

(65) Prior Publication Data

US 2022/0128740 A1     Apr. 28, 2022

(30) Foreign Application Priority Data

Oct. 26, 2020 (KR) .................. 10-2020-0139095

(51) Int. Cl.
| | | |
|---|---|---|
| *G02B 3/00* | (2006.01) | |
| *G02B 5/04* | (2006.01) | |
| *H01L 27/15* | (2006.01) | |
| *H01L 33/58* | (2010.01) | |
| *H10H 20/855* | (2025.01) | |
| *H10H 29/14* | (2025.01) | |

(52) U.S. Cl.
CPC ............ *G02B 3/0062* (2013.01); *G02B 5/04* (2013.01); *H10H 20/855* (2025.01); *H10H 29/142* (2025.01)

(58) Field of Classification Search
CPC ....... G02B 3/0062; G02B 5/04; H01L 27/156; H01L 33/58
USPC ......................................................... 359/737
See application file for complete search history.

(56) References Cited

U.S. PATENT DOCUMENTS

| | | | | |
|---|---|---|---|---|
| 10,812,783 | B1 * | 10/2020 | Peri ................... | G02B 3/0068 |
| 2011/0038051 | A1 * | 2/2011 | Shin .................... | G02B 3/005 |
| | | | | 359/619 |
| 2015/0009560 | A1 * | 1/2015 | Kang .................. | G02B 3/0062 |
| | | | | 359/463 |
| 2020/0212364 | A1 * | 7/2020 | Kim .................... | G06F 3/0446 |

FOREIGN PATENT DOCUMENTS

| | | |
|---|---|---|
| JP | 2008-282770 A | 11/2008 |
| KR | 10-1614898 B1 | 4/2016 |

* cited by examiner

*Primary Examiner* — Stephone B Allen
*Assistant Examiner* — Boutsikaris Leonidas
(74) *Attorney, Agent, or Firm* — Womble Bond Dickinson (US) LLP

(57) ABSTRACT

A tiled display device includes a plurality of display devices, and an optical member located on the display devices, wherein the optical member includes a base substrate, a plurality of first lenticular lenses located on a lower surface of the base substrate and extending in a first direction, and a plurality of second lenticular lenses located under the first lenticular lenses and extending in a second direction crossing the first direction.

20 Claims, 18 Drawing Sheets

SA1: SA11, SA12, SA13, SA14, SA15, SA16, SA17, SA18, SA19
SA2: SA21, SA22, SA23, SA24, SA25, SA26, SA27, SA28, SA29

TILED DISPLAY DEVICE

CROSS-REFERENCE TO RELATED APPLICATION

This application claims priority to and the benefit of Korean Patent Application No. 10-2020-0139095, filed on Oct. 26, 2020, in the Korean Intellectual Property Office, the disclosure of which is incorporated herein in its entirety by reference.

BACKGROUND

1. Field

The present disclosure relates to a tiled display device.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic or inorganic light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a large size, a defect rate of light emitting elements may increase due to an increase in the number of pixels, and productivity or reliability may be reduced. To solve these problems, a tiled display device may be implemented to provide a large screen by connecting a plurality of relatively small display devices. The tiled display device implemented by aligning a plurality of display devices to be adjacent to each other may be seen as one large display device. The tiled display device may include a boundary area between the display devices due to a non-display area or a bezel area of each of the display devices adjacent to each other. When one image is displayed on the entire screen, the boundary areas between the display devices may give a sense of separation to the entire screen, thereby reducing the degree of immersion in the image.

SUMMARY

Aspects of embodiments according to the present disclosure provide a tiled display device that can eliminate a sense of separation between a plurality of display devices and improve the degree of immersion in images by reducing or preventing the recognition of the boundary areas between the display devices.

Aspects of embodiments according to the present disclosure also provide a tiled display device which can not only increase the luminance of a boundary area between a plurality of display devices but also improve the front luminance of all display devices.

However, aspects of embodiments according to the present disclosure are not restricted to the one set forth herein. The above and other aspects of embodiments according to the present disclosure will become more apparent to one of ordinary skill in the art to which the present disclosure pertains by referencing the detailed description of the present disclosure given below.

According to an embodiment of the disclosure, the tiled display device includes a plurality of display devices, and an optical member located on the display devices, wherein the optical member includes a base substrate, a plurality of first lenticular lenses located on a lower surface of the base substrate and extending in a first direction, and a plurality of second lenticular lenses located under the first lenticular lenses and extending in a second direction crossing the first direction.

In an embodiment, in each of the display devices, a ratio of a width of one of the plurality of first lenticular lenses to a gap between adjacent ones of the plurality of first lenticular lenses gradually increases from 4:1 to 12:1 from a first side of each of the display devices extending in the first direction toward a middle of each of the display devices in the second direction.

In an embodiment, in each of the display devices, a ratio of a width of one of the plurality of second lenticular lenses to a gap between adjacent ones of the second lenticular lenses gradually increases from 4:1 to 12:1 from a second side of each of the display devices extending in the second direction toward a middle of each of the display devices in the first direction.

In an embodiment, widths of the plurality of first lenticular lenses and widths of the plurality of second lenticular lenses are variable, and the gap between adjacent ones of the plurality of first lenticular lenses and the gap between adjacent ones of the plurality of second lenticular lenses are the same.

In an embodiment, each of the display devices includes a display area and a non-display area surrounding the display area, the non-display area including a boundary area that is adjacent to the non-display areas of the adjacent ones of the plurality of display devices.

In an embodiment, the plurality of first lenticular lenses and the plurality of second lenticular lenses overlap the display area, the non-display area and the boundary area.

In an embodiment, the tiled display device further includes a plurality of first prism patterns located on an upper surface of the base substrate and extending in the first direction, a first upper planarization layer on the first prism patterns, and a plurality of second prism patterns located on the first upper planarization layer and extending in the second direction.

In an embodiment, the plurality of first prism patterns overlap the boundary area extending in the first direction, and the plurality of second prism patterns overlap the boundary area extending in the second direction.

In an embodiment, the plurality of first prism patterns and the plurality of second prism patterns do not overlap the display areas of the plurality of display devices.

In an embodiment, the tiled display device further includes a second lower planarization layer located under the second lenticular lenses.

According to an embodiment of the disclosure, the tiled display device includes: a plurality of display devices, and an optical member located on the plurality of display devices, wherein the optical member includes: a base substrate, and a plurality of first lenticular lenses located on a lower surface of the base substrate and extending in a first direction, wherein in each of the display devices, a ratio of a width of one of the plurality of first lenticular lenses to a gap between adjacent ones of the first lenticular lenses gradually increases from 4:1 to 12:1 from a first side of each of the display devices extending in the first direction toward a first center line passing through a center of each of the display devices in the first direction.

In an embodiment, the tiled display device further includes a first lower planarization layer located under the plurality of first lenticular lenses, and a plurality of second lenticular lenses located under the plurality of first lenticular lenses and extending in a second direction crossing the first direction, wherein a ratio of a width of one of the plurality of second lenticular lenses to a gap between adjacent ones of the plurality of second lenticular lenses gradually increases from 4:1 to 12:1 from a second side of each of the display devices extending in the second direction toward a second center line passing through the center of each of the display devices in the second direction.

In an embodiment, each of the display devices includes a display area and a non-display area surrounding the display area, the non-display area including a boundary area that is adjacent to the non-display areas of adjacent ones of the plurality of display devices.

In an embodiment, the plurality of first lenticular lenses and the plurality of second lenticular lenses overlap the display area, the non-display area, and the boundary area.

In an embodiment, the tiled display device further includes a plurality of first prism patterns located on an upper surface of the base substrate and extending in the first direction, a first upper planarization layer located on the first prism patterns, and a plurality of second prism patterns located on the first upper planarization layer and extending in the second direction.

According to an embodiment of the disclosure, the tiled display device includes a plurality of display devices, and an optical member located on the plurality of display devices and including a plurality of first sub areas extending in a first direction and spaced from each other along a second direction crossing the first direction and a plurality of second sub areas extending in the second direction and spaced from each other along the first direction, wherein the optical member includes a base substrate, and a plurality of first lenticular lenses located on a lower surface of the base substrate and extending in the first direction, wherein a ratio of a width of one of the plurality of first lenticular lenses to a gap between adjacent ones of the plurality of first lenticular lenses gradually increases from 4:1 to 12:1 from a first side of each of the display devices extending in the first direction toward a first center line passing through a center of each of the display devices in the first direction, and ratios of widths of the plurality of first lenticular lenses disposed in a same first sub area from among the plurality of first sub areas to the gap between adjacent ones of the plurality of first lenticular lenses are the same.

In an embodiment, the tiled display device further includes a first lower planarization layer located under the plurality of first lenticular lenses, and a plurality of second lenticular lenses located under the plurality of first lenticular lenses and extending in the second direction crossing the first direction, wherein a ratio of a width of one of the plurality of second lenticular lenses to a gap between adjacent ones of the plurality of second lenticular lenses gradually increases from 4:1 to 12:1 from a second side of each of the display devices extending in the second direction toward a second center line passing through a center of each of the display devices in the second direction, and ratios of widths of one of the plurality of second lenticular lenses located in a same second sub area from among the second sub areas to the gap between adjacent ones of the plurality of second lenticular lenses are the same.

In an embodiment, each of the plurality of display devices includes a display area and a non-display area surrounding the display area, the non-display area including a boundary area that is adjacent to the non-display areas of adjacent ones of the plurality of display devices, and the plurality of first lenticular lenses and the plurality of second lenticular lenses overlap the display area, the non-display area, and the boundary area.

In an embodiment, the tiled display device further includes a plurality of first prism patterns located on an upper surface of the base substrate and extending in the first direction, a first upper planarization layer located on the first prism patterns, and a plurality of second prism patterns located on the first upper planarization layer and extending in the second direction.

In an embodiment, the tiled display device further including a second lower planarization layer located under the plurality of second lenticular lenses.

BRIEF DESCRIPTION OF THE DRAWINGS

These and/or other aspects of embodiments according to the present disclosure will become apparent and more readily appreciated from the following description of the embodiments, taken in conjunction with the accompanying drawings in which.

DETAILED DESCRIPTION

Figure 1:
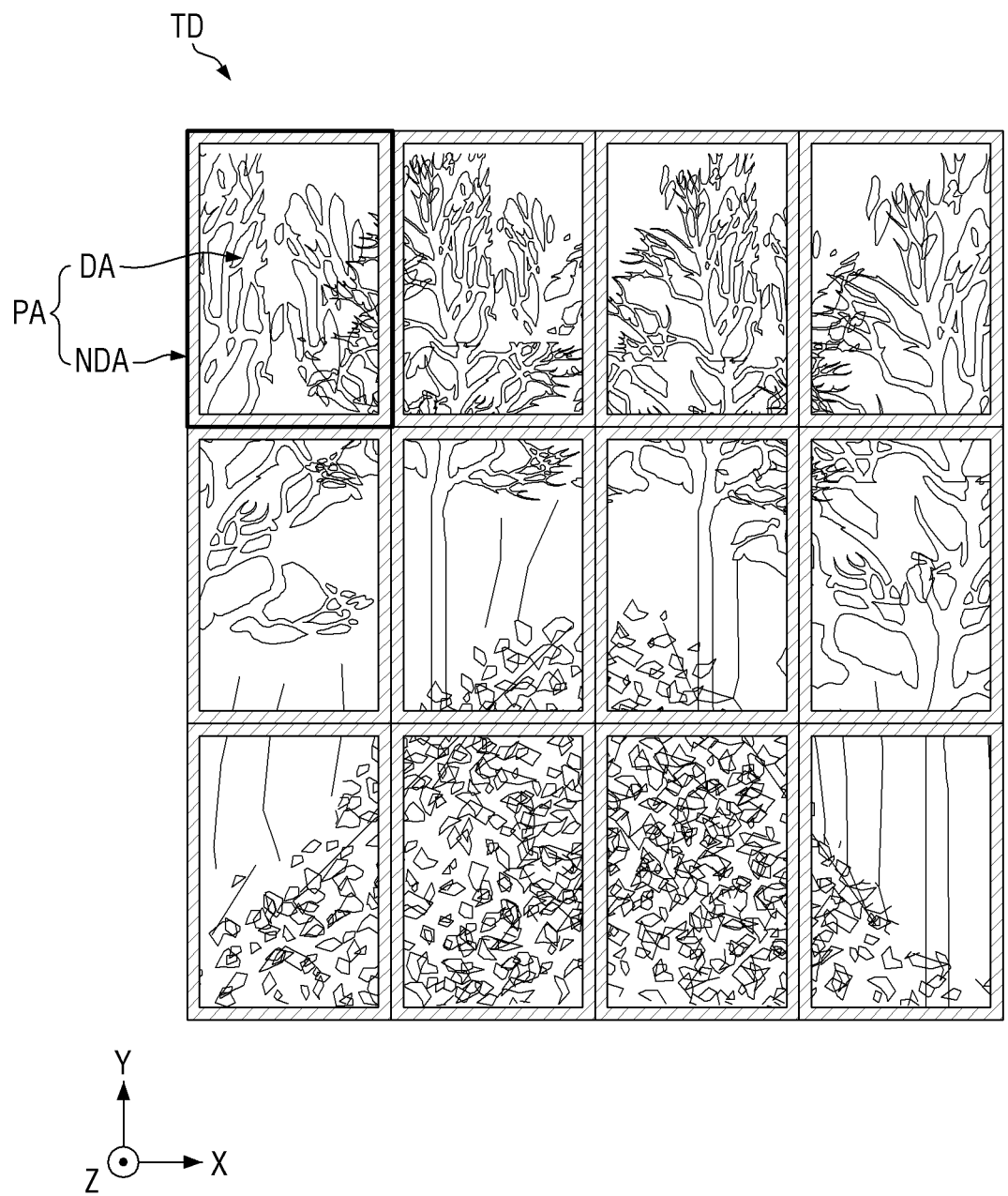
FIG. 1 is a plan view of a tiled display device according to an embodiment.

The present disclosure will now be described more fully hereinafter with reference to the accompanying drawings, in which embodiments of the present disclosure are shown.

The embodiments of the present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the present disclosure.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Each of the features of the various embodiments of the present disclosure may be combined or combined with each other, in part or in whole, and technically various interlocking and driving are possible. Each embodiment may be implemented independently of each other or may be implemented together in an association.

Hereinafter, some embodiments will be described with reference to the appended drawings.

FIG. 1 is a plan view of a tiled display device TD according to an embodiment.

Referring to FIG. 1, the tiled display device TD may include a plurality of display devices PA. The display devices PA may be arranged in a lattice shape, but the present disclosure is not limited thereto. The display devices PA may be connected to each other in a first direction (X-axis direction) or a second direction (Y-axis direction), and the tiled display device TD may have a specific shape. For example, the display devices PA may have the same size, but the present disclosure is not limited thereto. For another example, the display devices PA may have different sizes.

Each of the display devices PA may be shaped like a rectangle including long sides and short sides. The long sides or short sides of the display devices PA may be connected to each other. Some of the display devices PA may be disposed at an edge of the tiled display device TD to form a side of the tiled display device TD. Some other ones of the display devices PA may be disposed at corners of the tiled display device TD and may form two adjacent sides of the tiled display device TD. Some other ones of the display devices PA may be disposed inside (or located at a central region of) the tiled display device TD and surrounded by other display devices PA.

Each of the display devices PA may include a display area DA and a non-display area NDA. The display area DA may include a plurality of pixels to display an image. The non-display area NDA may be disposed around the display area DA to surround the display area DA along the edge or periphery of the display area DA and may not display an image.

The overall shape of the tiled display device TD may be a planar shape, but the present disclosure is not limited thereto. The tiled display device TD may also have a three-dimensional (3D) shape to provide a 3D effect to a user. For example, when the tiled display device TD has a 3D shape, at least some of the display devices PA may have a curved shape. For another example, the display devices PA may each have a planar shape but may be connected to each other at an angle (e.g., a set or predetermined angle) so that the tiled display device TD can have a 3D shape.

The tiled display device TD may be formed by connecting the respective non-display areas NDA of adjacent display devices PA. The display devices PA may be connected to each other through a coupling member or an adhesive member. Therefore, the non-display areas NDA between the display devices PA may be surrounded by adjacent display areas DA. A distance between the respective display areas DA of any two of the display devices PA may be small enough to make the non-display areas NDA between the display devices PA or a boundary part between the display devices PA unrecognizable by a user. In addition, external light reflectance of the display area DA of each of the display devices PA and external light reflectance of the non-display areas NDA between the display devices PA may be substantially equal. Therefore, the tiled display device TD may eliminate a sense of separation between the display devices PA and improve the degree of immersion in images by preventing the non-display areas NDA or the boundary part between the display devices PA from being recognized.

Figure 2:
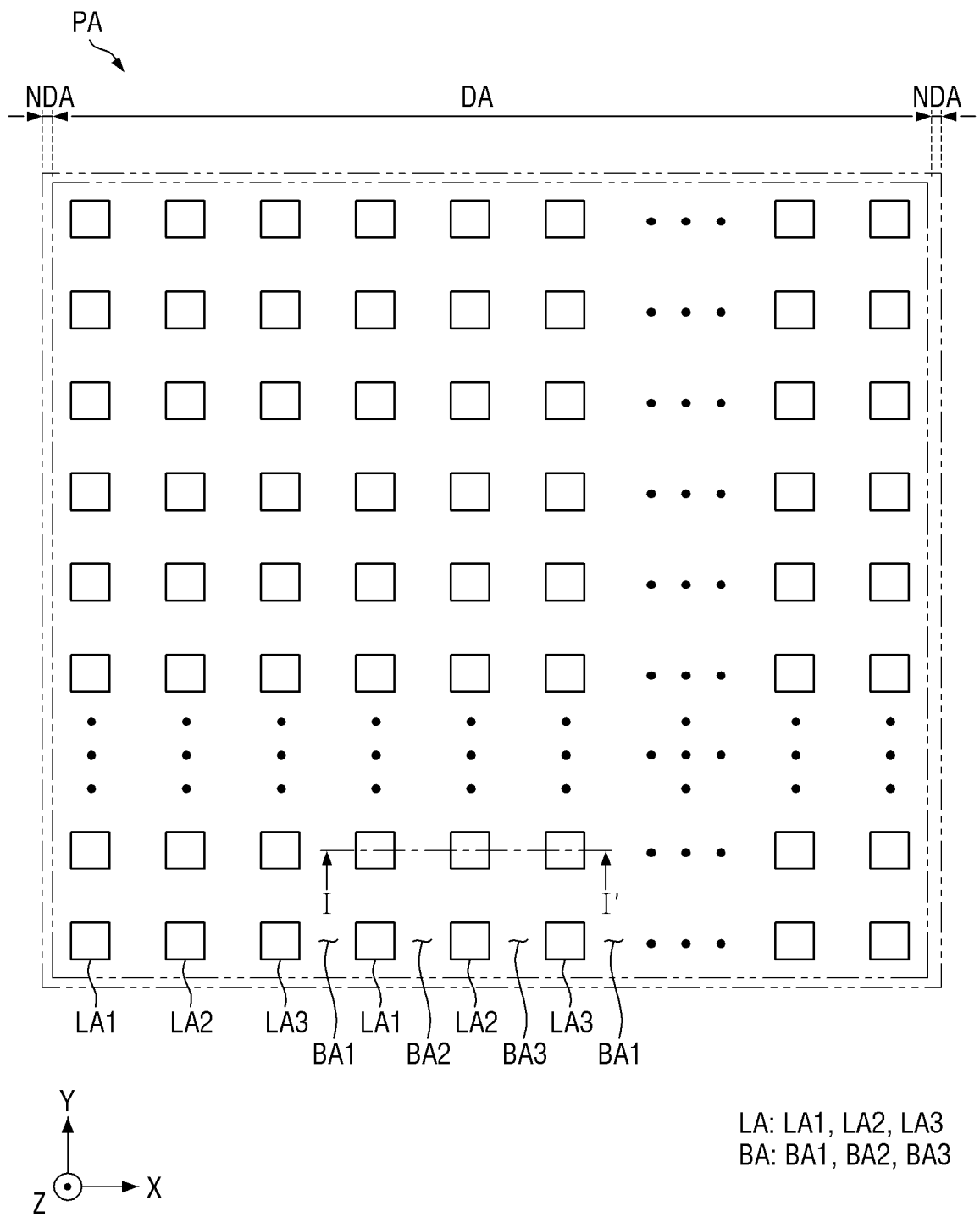
FIG. 2 is a plan view of a display device according to an embodiment.

FIG. 2 is a plan view of a display device PA according to an embodiment.

Referring to FIG. 2, the display device PA may include a plurality of pixels arranged along a plurality of rows and a plurality of columns in the display area DA. Each of the pixels may include a light emitting area LA defined by a pixel defining layer and may emit light (e.g., light having a set or predetermined peak wavelength) through the light emitting area LA. For example, the display area DA of the display device PA may include first to third light emitting areas LA1, LA2 and LA3. Each of the first to third light emitting areas LA1, LA2 and LA3 may be an area where light generated by a light emitting element of the display device PA is emitted to the outside of the display device PA.

Each of the first to third light emitting areas LA1, LA2 and LA3 may emit light (e.g., light having a set or predetermined peak wavelength) to the outside of the display device PA. The first light emitting area LA1 may emit light of a first color, the second light emitting area LA2 may emit light of a second color, and the third light emitting area LA3 may emit light of a third color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm. However, the present disclosure is not limited thereto.

The first to third light emitting areas LA1, LA2 and LA3 may be sequentially and repeatedly arranged along the first direction (X-axis direction) of the display area DA. For example, a width of the first light emitting area LA1 in the first direction (X-axis direction) may be greater than a width of the second light emitting area LA2 in the first direction, and the width of the second light emitting area LA2 in the first direction may be greater than a width of the third light emitting area LA3 in the first direction. For another example, the width of the first light emitting area LA1 in the first direction (X-axis direction), the width of the second light emitting area LA2 in the first direction, and the width of the third light emitting area LA3 in the first direction may be substantially equal.

For example, the area of the first light emitting area LA1 may be larger than the area of the second light emitting area LA2, and the area of the second light emitting area LA2 may be larger than the area of the third light emitting area LA3. For another example, the area of the first light emitting area LA1, the area of the second light emitting area LA2, and the area of the third light emitting area LA3 may be substantially equal.

The display area DA of the display device PA may include a plurality of light blocking areas BA surrounding the light emitting areas LA. For example, the display area DA may include first to third light blocking areas BA1 through BA3. The first to third light blocking areas BA1 through BA3 may be disposed on sides of the first to third light emitting areas LA1, LA2 and LA3, respectively, and may prevent color mixing of light emitted from the first to third light emitting areas LA1, LA2 and LA3.

Figure 3:
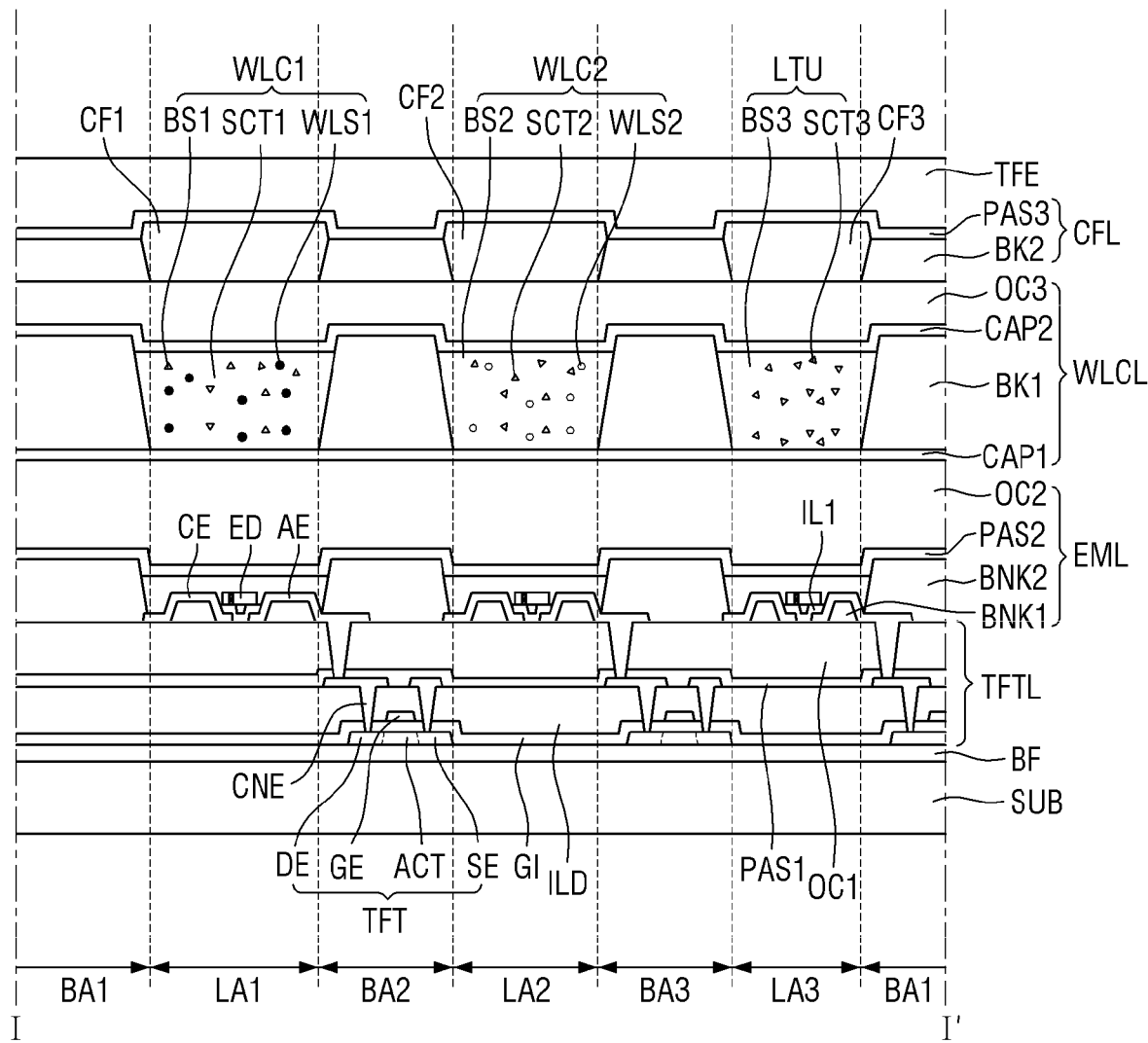
FIG. 3 is a cross-sectional view taken along the line I-I' of FIG. 2.

FIG. 3 is a cross-sectional view taken along the line I-I' of FIG. 2.

Referring to FIG. 3, the display area DA of the display device PA may include the first to third light emitting areas LA1, LA2 and LA3. Each of the first to third light emitting areas LA1, LA2 and LA3 may be an area where light generated by a light emitting diode ED of the display device PA is emitted to the outside of the display device PA.

The display device PA may include a substrate SUB, a buffer layer BF, a thin-film transistor layer TFTL, a light emitting element layer EML, a wavelength conversion layer WLCL, a color filter layer CFL, and an encapsulation layer TFE.

The substrate SUB may be a base substrate or a base member and may be made of an insulating material such as polymer resin. For example, the substrate SUB may be a flexible substrate that can be bent, folded, rolled, etc. The substrate SUB may include, but is not limited to, polyimide (PI).

The buffer layer BF may be disposed on the substrate SUB. The buffer layer BF may be an inorganic layer that can prevent penetration of air or moisture. For example, the buffer layer BF may include a plurality of inorganic layers stacked alternately.

The thin-film transistor layer TFTL may include thin-film transistors TFT, a gate insulating layer GI, an interlayer insulating film ILD, connection electrodes CNE, a first passivation layer PAS1, and a first planarization layer OC1.

The thin-film transistors TFT may be disposed on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may be overlapped by the gate electrode GE in a thickness direction of the substrate SUB and insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT in the thickness direction of the substrate SUB with the gate insulating layer GI interposed between them.

The gate insulating layer GI may be provided on the semiconductor regions ACT, the source electrodes SE, and the drain electrodes DE. For example, the gate insulating layer GI may cover the semiconductor regions ACT, the source electrodes SE, the drain electrodes DE, and the buffer layer BF and insulate the semiconductor regions ACT from the gate electrodes GE. The gate insulating layer GI may include contact holes through which the connection electrodes CNE pass.

The interlayer insulating film ILD may be disposed on the gate electrodes GE. For example, the interlayer insulating film ILD may include contact holes through which the connection electrodes CNE pass. Here, the contact holes of the interlayer insulating film ILD may be connected to the contact holes of the gate insulating layer GI.

The connection electrodes CNE may be disposed on the interlayer insulating film ILD. The connection electrodes CNE may connect the drain electrodes DE of the thin-film transistors TFT and first electrodes AE of light emitting elements EL. The connection electrodes CNE may contact the drain electrodes DE through the contact holes provided in the gate insulating layer GI and the interlayer insulating film ILD. Some other ones of the connection electrodes CNE may be connected to the source electrodes SE of the thin-film transistors TFT.

The first passivation layer PAS1 may be provided on the connection electrodes CNE to protect the thin-film transistors TFT. For example, the first passivation layer PAS1 may include contact holes through which the first electrodes AE of the light emitting elements EL pass to connect to the drain electrodes DE of the thin-film transistors TFT.

The first planarization layer OC1 may be provided on the first passivation layer PAS1 to planarize the top of the thin-film transistor layer TFTL. For example, the first planarization layer OC1 may include contact holes through which the first electrodes AE of the light emitting elements EL pass to connect to the drain electrodes DE of the thin-film transistors TFT. Here, the contact holes of the first planarization layer OC1 may be connected to the contact holes of the first passivation layer PAS1.

The light emitting element layer EML may include the light emitting elements EL, first banks BNK1, second banks BNK2, a second passivation layer PAS2, and a second planarization layer OC2.

The light emitting elements EL may be provided on the thin-film transistors TFT (e.g., the thin-film transistor layer TFTL). Each of the light emitting elements EL may include the first electrode AE, a second electrode CE, and the light emitting diode ED.

The first electrode AE may be provided on the first planarization layer OC1. For example, the first electrode AE may be disposed on a first bank BNK1 disposed on the first planarization layer OC1 to cover the first bank BNK1. The first electrode AE may overlap one of the first to third light emitting areas LA1, LA2 and LA3 defined by the second banks BNK2. In addition, the first electrode AE may be connected to the drain electrode DE of at least one corresponding thin-film transistor TFT of the pixel. The first electrode AE may be, but is not limited to, an anode of each light emitting element EL.

The second electrode CE may be disposed on the first planarization layer OC1 and spaced from the first electrode AE along the first direction (e.g., (X-axis direction). For example, the second electrode CE may be disposed on a first bank BNK1 disposed on the first planarization layer OC1 to cover the first bank BNK1. The second electrode CE may overlap one of the first to third light emitting areas LA1, LA2 and LA3 defined by the second banks BNK2. For example, the second electrode CE may receive a common voltage supplied to all pixels. The second electrode CE may be, but is not limited to, a cathode of each light emitting element EL.

A first insulating layer IL1 may cover a part of the first electrode AE and a part of the second electrode CE which are adjacent to each other and may insulate the first electrode AE and the second electrode CE from each other.

The light emitting diode ED may be disposed above the first planarization layer OC1 between the first electrode AE and the second electrode CE. The light emitting diode ED may be disposed on the first insulating layer IL1 disposed on the first planarization layer OC1 between the first electrode AE and the second electrode CE. An end of the light emitting diode ED may be connected to the first electrode AE, and the other end of the light emitting diode ED may be connected to the second electrode CE. For example, a plurality of light emitting diodes ED may include active layers having the same material to emit light of the same wavelength band or light of the same color. Light emitted from the first to third light emitting areas LA1, LA2 and LA3 may have the same color. For example, the light emitting diodes ED may emit light of the third color or blue light having a peak wavelength of 440 to 480 nm. Therefore, the light emitting element layer EML may emit light of the third color or blue light.

The second banks BNK2 may be disposed on the first planarization layer OC1 to define the first to third light emitting areas LA1, LA2 and LA3. For example, the second banks BNK2 may surround each of the first to third light emitting areas LA1, LA2 and LA3, but the present disclosure is not limited thereto. The second banks BNK2 may separate and insulate a first electrode AE or a second electrode CE of a light emitting element EL from the first electrodes AE or the second electrodes CE of the adjacent light emitting elements EL. The second banks BNK2 may be disposed in the first to third light blocking areas BA1, BA2 and BA3.

The second passivation layer PAS2 may be disposed on the light emitting elements EL and the second banks BNK2. The second passivation layer PAS2 may cover the light emitting elements EL and protect the light emitting elements EL. The second passivation layer PAS2 may prevent damage to the light emitting elements EL by preventing penetration of impurities such as moisture or air from the outside.

The second planarization layer OC2 may be provided on the second passivation layer PAS2 to planarize the top of the light emitting element layer EML. The second planarization layer OC2 may include an organic material. For example, the second planarization layer OC2 may include at least one of acryl resin, epoxy resin, phenolic resin, polyamide resin, and polyimide resin.

The wavelength conversion layer WLCL may include a first capping layer CAP1, first light blocking members BK1, a first wavelength conversion part WLC1, a second wavelength conversion part WLC2, a light transmission part LTU, a second capping layer CAP2, and a third planarization layer OC3.

The first capping layer CAP1 may be disposed on the second planarization layer OC2 of the light emitting element layer EML. The first capping layer CAP1 may seal lower surfaces of the first and second wavelength conversion parts WLC1 and WLC2 and the light transmission part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking members BK1 may be disposed on the first capping layer CAP1 in the first to third light blocking areas BA1 through BA3. The first light blocking members BK1 may overlap the second banks BNK2 in the thickness direction of the substrate SUB. The first light blocking members BK1 may block transmission of light. The first light blocking members BK1 may prevent color mixing by preventing intrusion of light between the first to third light emitting areas LA1, LA2 and LA3, thereby improving a color gamut. The first light blocking members BK1 may be disposed in a lattice shape surrounding the first to third light emitting areas LA1, LA2 and LA3 in a plan view.

The first light blocking members BK1 may include an organic light blocking material and a liquid repellent component. Here, the liquid repellent component may be made of a fluorine-containing monomer or a fluorine-containing polymer, for example, may include fluorine-containing aliphatic polycarbonate. For example, the first light blocking members BK1 may be made of a black organic material including a liquid repellent component. The first light blocking members BK1 may be formed by coating and exposing an organic light blocking material including a liquid repellent component.

The first light blocking members BK1 including a liquid repellent component may separate the first and second wavelength conversion parts WLC1 and WLC2 and the light transmission part LTU into corresponding light emitting areas LA. For example, when the first and second wavelength conversion parts WLC1 and WLC2 and the light transmission part LTU are formed using an inkjet method, an ink composition may flow on upper surfaces of the first light blocking members BK1. In this case, the first light blocking members BK1 including a liquid repellent component may guide the ink composition to flow into each light emitting area. Therefore, the first light blocking members BK1 can prevent mixing of the ink composition.

The first wavelength conversion part WLC1 may be disposed on the first capping layer CAP1 in the first light emitting area LA1. The first wavelength conversion part WLC1 may be surrounded by the first light blocking members BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. For example, the first wavelength shifters WLS1 may convert blue light provided by the display device PA into red light having a single peak wavelength of 610 to 650 nm and emit the red light. The first wavelength shifters WLS1 may be quantum dots, quantum rods, or phosphors. The quantum dots may be particulate materials that emit light of a specific color when electrons transition from a conduction band to a valence band.

For example, the quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include Group IV nanocrystals, Group II-VI compound nanocrystals, Group III-V compound nanocrystals, Group IV-VI nanocrystals, and combinations of the same.

For example, the quantum dots may have a core-shell structure including a core containing the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element present in the shell is reduced toward the middle. The shell of each quantum dot may be made of, for example, a metal or non-metal oxide, a semiconductor compound, or a combination of the same.

Light emitted from the first wavelength shifters WLS1 may have a full width of half maximum (FWHM) of an emission wavelength spectrum of 45 nm or less, 40 nm or less, or 30 nm or less. Therefore, the color purity and color reproducibility of the display device PA can be further improved. In addition, the light emitted from the first wavelength shifters WLS1 may be radiated in various directions regardless of the incident direction of incident light. Therefore, the lateral visibility of red displayed in the first light emitting area LA1 can be improved.

A part of blue light provided by the light emitting element layer EML may be transmitted through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. In addition, red light that is produced, by converting the blue light provided by the light emitting element layer EML, by the first wavelength conversion part WLC1, may be emitted to the outside through the first color filter CF1. Therefore, the first light emitting area LA1 may emit red light.

The second wavelength conversion part WLC2 may be disposed on the first capping layer CAP1 in the second light emitting area LA2. The second wavelength conversion part WLC2 may be surrounded by the first light blocking members BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of any of the materials discussed in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of any of the materials discussed in the description of the first scatterers SCT1. The second scatterers SCT2 may scatter incident light in random directions regardless of the incident direction of the incident light without substantially converting the peak wavelength of the incident light.

The second wavelength shifters WLS2 may convert or shift the peak wavelength of incident light into a second peak wavelength different from the first peak wavelength of the first wavelength shifters WLS1. For example, the second wavelength shifters WLS2 may convert blue light provided by the display device PA into green light having a single peak wavelength of 510 to 550 nm and emit the green light. The second wavelength shifters WLS2 may be quantum dots, quantum rods, or phosphors. The second wavelength shifters WLS2 may include a material having the same purpose as the materials discussed in the description of the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmission part LTU may be disposed on the first capping layer CAP1 in the third light emitting area LA3. The light transmission part LTU may be surrounded by the first light blocking members BK1. The light transmission part LTU may transmit incident light while maintaining the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first base resin BS1 or the second base resin BS2 or may be made of any of the materials discussed in the description of the first base resin BS1 or the second base resin BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first or second scatterers SCT1 or SCT2 or may be made of any of the materials discussed in the description of the first or second scatterers SCT1 or SCT2. The third scatterers SCT3 may scatter incident light in random directions regardless of the incident direction of the incident light without substantially converting the peak wavelength of the incident light.

Because the wavelength conversion layer WLCL is directly disposed on the second planarization layer OC2 of the light emitting element layer EML, the display device PA may not require a separate substrate for the first and second wavelength conversion parts WLC1 and WLC2 and the light transmission part LTU. Therefore, the first and second wavelength conversion parts WLC1 and WLC2 and the light transmission part LTU can be aligned in the first to third light emitting areas LA1, LA2 and LA3, respectively, and the thickness of the display device PA can be relatively reduced.

The second capping layer CAP2 may cover the first and second wavelength conversion parts WLC1 and WLC2, the light transmission part LTU, and the first light blocking members BK1. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. The second capping layer CAP2 may be made of the same material as the first capping layer CAP1 or may be made of any of the materials discussed in the description of the first capping layer CAP1.

The third planarization layer OC3 may be disposed on the second capping layer CAP2 to planarize the tops of the first and second wavelength conversion parts WLC1 and WLC2 and the light transmission part LTU. The third planarization layer OC3 may include an organic material. For example, the third planarization layer OC3 may include at least one of acryl resin, epoxy resin, phenolic resin, polyamide resin, and polyimide resin.

The color filter layer CFL may include second light blocking members BK2, first to third color filters CF1, CF2 and CF3, and a third passivation layer PAS3.

The second light blocking members BK2 may be disposed on the third planarization layer OC3 of the wavelength conversion layer WLCL in the first to third light blocking areas BA1, BA2 and BA3. The second light blocking members BK2 may overlap the first light blocking members BK1 or the second banks BNK2 in the thickness direction of the substrate SUB. The second light blocking members BK2 may block transmission of light. The second light blocking members BK2 may prevent color mixing by preventing intrusion of light between the first to third light emitting areas LA1, LA2 and LA3, thereby improving the color gamut. The second light blocking members BK2 may be disposed in a lattice shape surrounding the first to third light emitting areas LA1, LA2 and LA3 in a plan view.

The first color filter CF1 may be disposed on the third planarization layer OC3 in the first light emitting area LA1. The first color filter CF1 may be surrounded by the second light blocking members BK2. The first color filter CF1 may overlap the first wavelength conversion part WLC1 in the thickness direction of the substrate SUB. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant. The red colorant may be made of red dye or red pigment.

The second color filter CF2 may be disposed on the third planarization layer OC3 in the second light emitting area LA2. The second color filter CF2 may be surrounded by the second light blocking members BK2. The second color filter CF2 may overlap the second wavelength conversion part WLC2 in the thickness direction of the substrate SUB. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant. The green colorant may be made of green dye or green pigment.

The third color filter CF3 may be disposed on the third planarization layer OC3 in the third light emitting area LA3. The third color filter CF3 may be surrounded by the second light blocking members BK2. The third color filter CF3 may overlap the light transmission part LTU in the thickness direction of the substrate SUB. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant. The blue colorant may be made of blue dye or blue pigment.

The first to third color filters CF1, CF2 and CF3 may absorb a part of light coming from the outside of the display device PA, thereby reducing reflected light due to the external light. Therefore, the first to third color filters CF1, CF2 and CF3 may prevent color distortion due to reflection of external light.

Because the first to third color filters CF1, CF2 and CF3 are directly disposed on the third planarization layer OC3 of the wavelength conversion layer WLCL, the display device PA may not require a separate substrate for the first to third color filters CF1, CF2 and CF3. Therefore, the thickness of the display device PA can be relatively reduced.

The third passivation layer PAS3 may cover the first to third color filters CF1, CF2 and CF3. The third passivation layer PAS3 may protect the first to third color filters CF1, CF2 and CF3.

The encapsulation layer TFE may be disposed on the third passivation layer PAS3 of the color filter layer CFL. The encapsulation layer TFE may cover upper and side surfaces of a display layer. For example, the encapsulation layer TFE may include at least one inorganic layer to prevent penetration of oxygen or moisture. In addition, the encapsulation layer TFE may include at least one organic layer to protect the display device PA from foreign substances such as dust.

Figure 4:
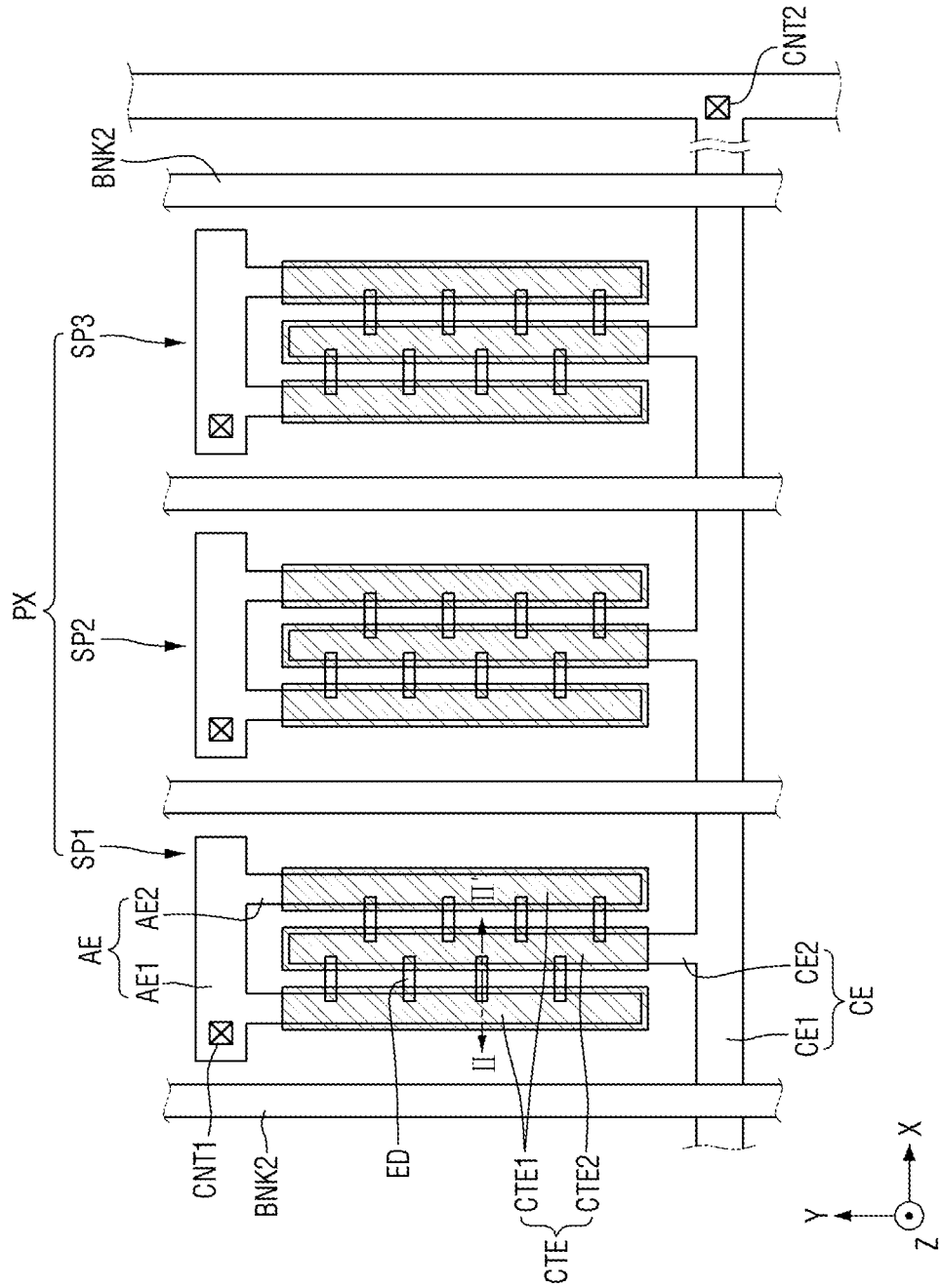
FIG. 4 is a plan view of a pixel of the display device of FIG. 2 according to an embodiment.

FIG. 4 is a plan view of a pixel PX of the display device PA of FIG. 2 according to an embodiment.

Referring to FIG. 4, each of a plurality of pixels PX may include first to third subpixels SP1, SP2, and SP3. The first to third subpixels SP1, SP2, and SP3 may correspond to the first to third light emitting areas LA1, LA2, and LA3, respectively. The light emitting diodes ED of the first to third subpixels SP1, SP2, and SP3 may emit light through the first to third light emitting areas LA1, LA2, and LA3, respectively.

The first to third subpixels SP1, SP2 and SP3 may emit light of the same color. For example, the first to third subpixels SP1, SP2, and SP3 may include the same type of light emitting diodes ED and emit light of the third color or blue light. For another example, the first subpixel SP1 may emit light of the first color or red light, the second subpixel SP2 may emit light of the second color or green light, and the third subpixel SP3 may emit light of the third color or blue light.

Each of the first to third subpixels SP1, SP2 and SP3 may include the first and second electrodes AE and CE, the light emitting diodes ED, a plurality of contact electrodes CTE, and a plurality of second banks BNK2.

The first and second electrodes AE and CE may be electrically connected to the light emitting diodes ED to receive a voltage (e.g. a set or predetermined voltage), and the light emitting diodes ED may emit light of a specific wavelength band. At least a portion of each of the first and second electrodes AE and CE may form an electric field in the pixel PX, and the light emitting diodes ED may be aligned by the electric field.

For example, the first electrode AE may be a pixel electrode separate for each of the first to third subpixels SP1, SP2 and SP3, and the second electrode CE may be a common electrode connected in common to the first to third subpixels SP1, SP2 and SP3. Any one of the first electrode AE and the second electrode CE may be an anode of each light emitting diode ED, and the other one may be a cathode of each light emitting diode ED.

The first electrode AE may include a first electrode stem part AE1 extending in the first direction (X-axis direction) and one or more first electrode branch parts AE2 branching from the first electrode stem part AE1 to extend in a direction opposite to the second direction (Y-axis direction).

The first electrode stem part AE1 of each of the first to third subpixels SP1, SP2, and SP3 may be spaced from the first electrode stem part AE1 of an adjacent subpixel and may be disposed on an imaginary extension line with the first electrode stem part AE1 of the subpixel adjacent in the first direction (X-axis direction). The respective first electrode stem parts AE1 of the first to third subpixels SP1, SP2, and SP3 may receive different signals and may be driven independently.

The first electrode branch parts AE2 may branch from the first electrode stem part AE1 to extend in the direction opposite to the second direction (Y-axis direction). An end of each first electrode branch part AE2 may be connected to the first electrode stem part AE1, and the other end of each first electrode branch part AE2 may be spaced from a second electrode stem part CE1 facing the first electrode stem part AE1 along the second direction (Y-axis direction).

The second electrode CE may include the second electrode stem part CE1 extending in the first direction (X-axis direction) and a second electrode branch part CE2 branching from the second electrode stem part CE1 to extend in the second direction (Y-axis direction). The second electrode stem part CE1 of each of the first to third subpixels SP1, SP2 and SP3 may be connected to the second electrode stem part CE1 of an adjacent subpixel. The second electrode stem part CE1 may extend in the first direction (X-axis direction) across a plurality of pixels PX. The second electrode stem part CE1 may be connected to the periphery of the display area DA or a part extending in a direction in the non-display area NDA.

The second electrode branch part CE2 may be spaced from the first electrode branch parts AE2 to face them. An end of the second electrode branch part CE2 may be connected to the second electrode stem part CE1, and the other end of the second electrode branch part CE2 may be spaced from the first electrode stem part AE1 along the second direction (Y-axis direction).

The first electrode AE may be electrically connected to the thin-film transistor layer TFTL of the display device PA through a first contact hole CNT1, and the second electrode CE may be electrically connected to the thin-film transistor layer TFTL of the display device PA through a second contact hole CNT2. For example, the first contact hole CNT1 may be disposed in each of the first electrode stem parts AE1, and the second contact hole CNT2 may be disposed in the second electrode stem part CE1, but the present disclosure is not limited thereto.

The second banks BNK2 may be disposed at boundaries between a plurality of pixels PX and/or a plurality of sub-pixels SP. A plurality of first electrode stem parts AE1 may be spaced from each other by the second banks BNK2. The second banks BNK2 may extend in the second direction (Y-axis direction) and may be disposed at the boundaries of sub-pixels SP arranged along the first direction (X-axis direction). Additionally, the second banks BNK2 may be disposed at the boundaries of sub-pixels SP arranged along the second direction (Y-axis direction). The second banks BNK2 may define the boundaries of the pixels PX.

The second banks BNK2 may prevent ink from crossing the boundaries of adjacent sub-pixels SP when the ink in which the light emitting diodes ED are dispersed is sprayed during the manufacture of the display device PA. The second banks BNK2 may separate inks in which different light emitting diodes ED are dispersed so that the inks are not mixed with each other.

The light emitting diodes ED may be disposed between the first electrode AE and the second electrode CE. First ends of the light emitting diodes ED may be connected to the first electrode AE, and second ends of the light emitting diodes ED may be connected to the second electrode CE. For example, the light emitting diodes ED may be connected to the first electrode AE through first contact electrodes CTE1 and may be connected to the second electrode CE through a second contact electrode CTE2.

The light emitting diodes ED may be spaced from each other and aligned substantially parallel to each other. A gap between the light emitting diodes ED is not particularly limited. Some of the light emitting diodes ED may be disposed adjacent to each other, some other ones of the light emitting diodes ED may be spaced from each other by a suitable distance (e.g., a set or predetermined distance), and some other ones of the light emitting diodes ED may be disposed with non-uniform density but may be aligned in a specific direction. For example, each of the light emitting diodes ED may be disposed in a direction perpendicular to the direction in which each first electrode branch part AE2 or the second electrode branch part CE2 extends. For another example, each of the light emitting diodes ED may be disposed in a direction oblique to the direction in which each first electrode branch part AE2 or the second electrode branch part CE2 extends.

The light emitting diodes ED may include active layers having the same material to emit light of the same wavelength band or light of the same color. The first to third subpixels SP1, SP2 and SP3 may emit light of the same color. For example, the light emitting diodes ED may emit light of the third color or blue light having a peak wavelength of 440 to 480 nm. Therefore, the light emitting element layer EML of the display device PA may emit light of the third color or blue light. For another example, the first to third subpixels SP1, SP2 and SP3 may include light emitting diodes ED having different active layers to emit light of different colors.

The contact electrodes CTE may include the first and second contact electrodes CTE1 and CTE2. The first contact electrodes CTE1 may cover the first electrode branch parts AE2 and a portion of each light emitting diode ED and may electrically connect the first electrode branch parts AE2 and the light emitting diodes ED. The second contact electrode CTE2 may cover the second electrode branch part CE2 and another portion of each light emitting diode ED and may electrically connect the second electrode branch part CE2 and the light emitting diodes ED.

The first contact electrodes CTE1 may be disposed on the first electrode branch parts AE2 to extend in the second direction (Y-axis direction). The first contact electrodes CTE1 may contact the first ends of the light emitting diodes ED. The light emitting diodes ED may be electrically connected to the first electrode AE through the first contact electrodes CTE1.

The second contact electrode CTE2 may be disposed on the second electrode branch part CE2 to extend in the second direction (Y-axis direction). The second contact electrode CTE2 may be spaced from the first contact electrodes CTE1 along the first direction (X-axis direction). The second contact electrode CTE2 may contact the second ends of the light emitting diodes ED. The light emitting diodes ED may be electrically connected to the second electrode CE through the second contact electrode CTE2.

For example, respective widths of the first and second contact electrodes CTE1 and CTE2 may be greater than respective widths of the first and second electrode branch parts AE2 and CE2. For another example, the first and second contact electrodes CTE1 and CTE2 may cover respective sides of the first and second electrode branch parts AE2 and CE2, respectively.

Figure 5:
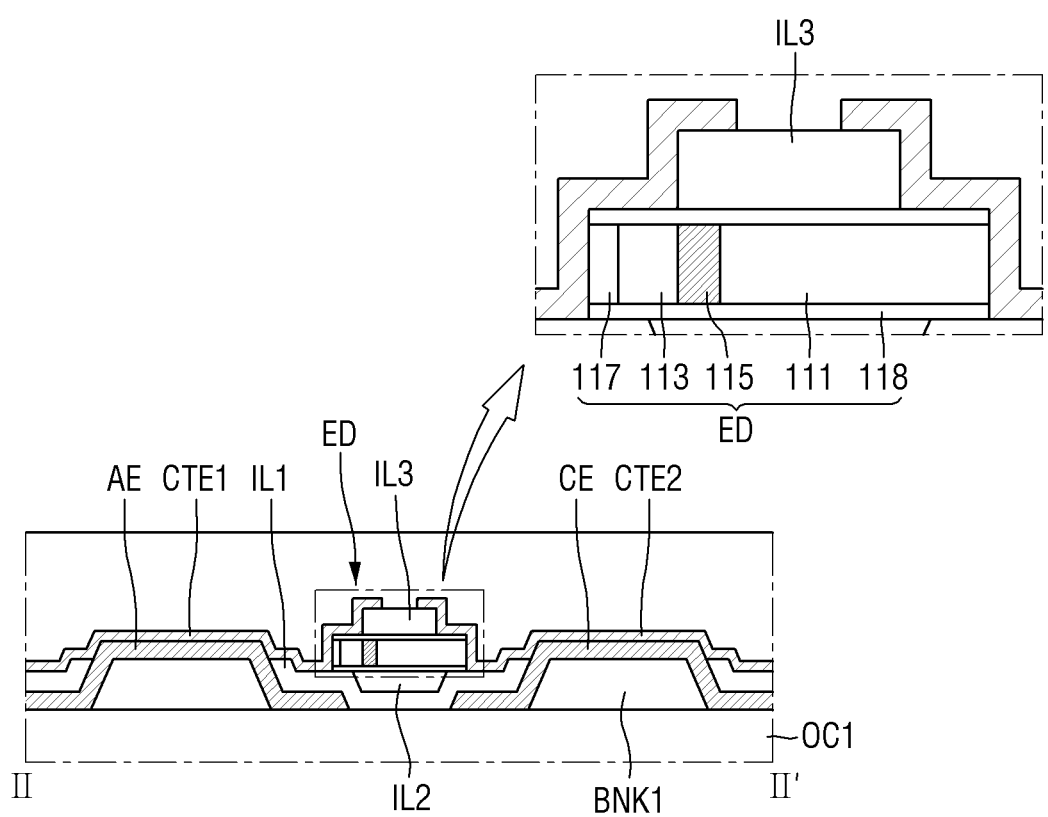
FIG. 5 is a cross-sectional view taken along the line II-II' of FIG. 4.

FIG. 5 is a cross-sectional view taken along the line II-II' of FIG. 4.

Referring to FIG. 5, the light emitting element layer EML of the display device PA may be disposed on the thin-film transistor layer TFTL and may include first to third insulating layers IL1, IL2 and IL3.

A plurality of first banks BNK1 may be disposed in each of the first to third light emitting areas LA1, LA2 and LA3. Each of the first banks BNK1 may correspond to the first electrode AE or the second electrode CE. Each of the first and second electrodes AE and CE may be disposed on a corresponding first bank BNK1. For example, each of the first and second electrode branch parts AE2 and CE2 may be disposed on a corresponding first bank BNK1. The first banks BNK1 may include, but are not limited to, polyimide (PI).

The first banks BNK1 may be disposed on the first planarization layer OC1, and side surfaces of each of the first banks BNK1 may be inclined from the first planarization layer OC1. For example, each of the first and second electrodes AE and CE may include a material having high reflectivity and may be disposed on the inclined surfaces of a first bank BNK1 to reflect light incident from a light emitting diode ED to above the display device PA.

Referring to FIG. 5 in conjunction with FIG. 4, the first electrode stem part AE1 may include the first contact hole CNT1 penetrating the first planarization layer OC1. The first electrode stem part AE1 may be electrically connected to a thin-film transistor TFT through the first contact hole CNT1. Therefore, the first electrode AE may receive an electrical signal (e.g., a set or predetermined electrical signal) from the thin-film transistor TFT.

The second electrode stem part CE1 may extend in the first direction (X-axis direction) and may also be disposed in a non-light emitting area in which the light emitting diode ED is not disposed. The second electrode stem part CE1 may include the second contact hole CNT2 penetrating the first planarization layer OC1. The second electrode stem part CE1 may be electrically connected to a power electrode through the second contact hole CNT2. The second electrode CE may receive an electrical signal (e.g., a set or predetermined electrical signal) from the power electrode.

The first and second electrodes AE and CE may include a transparent conductive material. For example, each of the first and second electrodes AE and CE may include, but is not limited to, at least one of indium tin oxide (ITO), indium zinc oxide (IZO), and indium tin zinc oxide (ITZO).

The first and second electrodes AE and CE may include a conductive material having high reflectivity. For example, the first and second electrodes AE and CE may include a metal having high reflectivity, such as silver (Ag), copper (Cu), or aluminum (Al). The first and second electrodes AE and CE may reflect light incident from the light emitting diode ED to above the display device PA.

Each of the first and second electrodes AE and CE may have a structure in which a transparent conductive material and a metal having high reflectivity are each stacked in one or more layers or may be formed as a single layer including them. For example, each of the first and second electrodes AE and CE may have a stacked structure of ITO/Ag/ITO/IZO or may be an alloy including aluminum (Al), nickel (Ni), lanthanum (La) or the like, but the present disclosure is not limited thereto.

The first insulating layer IL1 may be disposed on the first planarization layer OC1, the first electrode AE, and the second electrode CE. The first insulating layer IL1 may cover a portion of each of the first and second electrodes AE and CE. For example, the first insulating layer IL1 may expose parts of the first and second electrodes AE and CE which correspond to upper surfaces of the first banks BNK1 and may cover parts of the first and second electrodes AE and CE which do not correspond to the upper surfaces of the first banks BNK1. Therefore, the first insulating layer IL1 may include openings that expose the parts of the first and second electrodes AE and CE which correspond to the upper surfaces of the first banks BNK1.

For example, the first insulating layer IL1 may include an inorganic insulating material and include a step recessed between the first and second electrodes AE and CE. The second insulating layer IL2 may fill the recessed step of the first insulating layer IL1. Therefore, the second insulating layer IL2 may planarize an upper surface of the first insulating layer IL1, and the light emitting diode ED may be disposed on the first and second insulating layers IL1 and IL2.

The first insulating layer IL1 may protect the first and second electrodes AE and CE and insulate the first and second electrodes AE and CE from each other. The first insulating layer IL1 may prevent the light emitting diode ED from directly contacting other members and thus being damaged.

The light emitting diode ED may be disposed on the first and second insulating layers IL1 and IL2 between the first electrode AE and the second electrode CE. The first end of the light emitting diode ED may be connected to the first electrode AE, and the second end of the light emitting diode ED may be connected to the second electrode CE. For example, the light emitting diode ED may be connected to the first electrode AE through a first contact electrode CTE1 and may be connected to the second electrode CE through the second contact electrode CTE2.

The third insulating layer IL3 may be disposed on a portion of the light emitting diode ED disposed between the first and second electrodes AE and CE. The third insulating layer IL3 may partially cover an outer surface of the light emitting diode ED. The third insulating layer IL3 may protect the light emitting diode ED.

The contact electrodes CTE may include the first and second contact electrodes CTE1 and CTE2. The first contact electrode CTE1 may cover a first electrode branch part AE2 and a portion of the light emitting diode ED and may electrically connect the first electrode branch part AE2 and the light emitting diode ED. The second contact electrode CTE2 may cover the second electrode branch part CE2 and another portion of the light emitting diode ED and may electrically connect the second electrode branch part CE2 and the light emitting diode ED.

The contact electrodes CTE may include a conductive material. For example, the contact electrodes CTE may include, but are not limited to, ITO, IZO, ITZO, or aluminum (Al).

Figure 6:
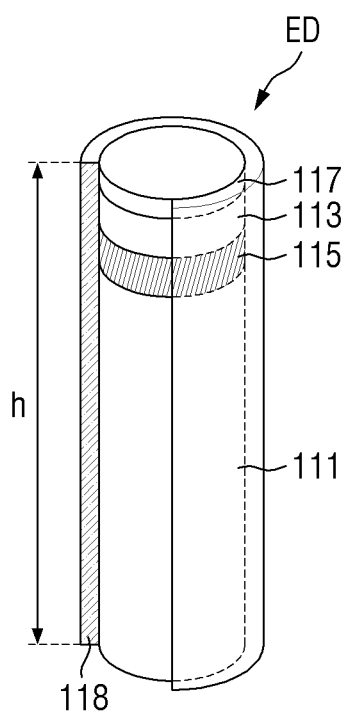
FIG. 6 is a cutaway view of a light emitting diode according to an embodiment.

FIG. 6 is a cutaway view of a light emitting diode ED according to an embodiment.

Referring to FIG. 6, the light emitting diode ED may be provided. For example, the light emitting diode ED may be an inorganic light emitting diode having a size of nanometers or micrometers and made of an inorganic material. When an electric field is formed in a specific direction between two electrodes facing each other, the inorganic light emitting diode ED may be aligned between the two electrodes in which polarities are formed. The light emitting diode ED may be aligned between the two electrodes by the electric field formed between the two electrodes.

The light emitting diode ED according to the embodiment may extend in one direction. The light emitting diode ED may be shaped like a cylinder, a rod, a wire, a tube, or the like. However, the shape of the light emitting diode ED is not limited thereto, and the light emitting diode ED may also have various shapes including polygonal prisms, such as a cube, a rectangular parallelepiped and a hexagonal prism, and a shape extending in a direction and having a partially inclined outer surface. A plurality of semiconductors included in the light emitting diode ED may be sequentially disposed or stacked along the one direction (e.g., X-axis direction).

The light emitting diode ED may include a semiconductor layer doped with impurities of any conductivity type (e.g., a p type or an n type). The semiconductor layer may receive an electrical signal from an external power source and emit light of a specific wavelength band.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, when the light emitting diode ED emits blue light, the first semiconductor layer 111 may include a semiconductor material having a chemical formula of AlxGayIn1-x-yN (0≤x≤1, 0≤y≤1, 0≤x+y≤1). The first semiconductor layer 111 may include at least one semiconductor material selected from n-type doped AlGaInN, GaN, AlGaN, InGaN, AlN, and InN. The first semiconductor layer 111 may be doped with an n-type dopant such as Si, Ge, or Sn. The first semiconductor layer 111 may be n-GaN doped with n-type Si. A length of the first semiconductor layer 111 may be, but is not limited to, in the range of 1.5 to 5 µm.

The second semiconductor layer 113 may be disposed on the active layer 115 that is disposed between the first semiconductor layer 111 and the second semiconductor layer 113. For example, when the light emitting diode ED emits blue light or green light, the second semiconductor layer 113 may include a semiconductor material having a chemical formula of AlxGayIn1-x-yN (0≤x≤1, 0≤y≤1, 0≤x+y≤1). For example, the second semiconductor layer 113 may include at least one semiconductor material selected from p-type doped AlGaInN, GaN, AlGaN, InGaN, AlN, and InN. The second semiconductor layer 113 may be doped with a p-type dopant such as Mg, Zn, Ca, Se, or Ba. The second semiconductor layer 113 may be p-GaN doped with p-type Mg. A length of the second semiconductor layer 113 may be, but is not limited to, in the range of 0.05 to 0.10 µm.

Each of the first and second semiconductor layers 111 and 113 may be formed as a single layer, but the present disclosure is not limited thereto. For example, each of the first and second semiconductor layers 111 and 113 may have a plurality of layers including a clad layer or a tensile strain barrier reducing (TSBR) layer.

The active layer 115 may be disposed between the first and second semiconductor layers 111 and 113. The active layer 115 may include a material having a single or multiple quantum well structure. When the active layer 115 includes a material having a multiple quantum well structure, it may have a structure in which a plurality of quantum layers and a plurality of well layers are alternately stacked. The active layer 115 may emit light through combination of electron-hole pairs according to electrical signals received through the first and second semiconductor layers 111 and 113. For example, when the active layer 115 emits blue light, it may include a material such as AlGaN or AlGaInN. When the active layer 115 has a multiple quantum well structure in which a quantum layer and a well layer are alternately stacked, the quantum layer may include a material such as AlGaN or AlGaInN, and the well layer may include a material such as GaN or AlInN. The active layer 115 may include AlGaInN as a quantum layer and AlInN as a well layer to emit blue light.

For another example, the active layer 115 may have a structure in which a semiconductor material having a large band gap energy and a semiconductor material having a small band gap energy are alternately stacked or may include different Group III to V semiconductor materials depending on the wavelength band of light that it emits. Light emitted from the active layer 115 is not limited to blue light. In some cases, the active layer 115 may emit red or green light. A length of the active layer 115 may be, but is not limited to, in the range of 0.05 to 0.10 μm.

Light emitted from the active layer 115 may be radiated not only in a longitudinal direction of the light emitting diode ED but also toward both side surfaces of the light emitting diode LD. That is, the direction of light emitted from the active layer 115 is not limited.

The electrode layer 117 may be an ohmic contact electrode. Alternatively, the electrode layer 117 may be a Schottky contact electrode. The light emitting diode ED may include at least one electrode layer 117. When the light emitting diode ED is electrically connected to an electrode or a contact electrode CTE, the electrode layer 117 may reduce the resistance between the light emitting diode ED and the electrode or the contact electrode CTE. The electrode layer 117 may include a conductive metal. For example, the electrode layer 117 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 117 may include an n-type or p-type doped semiconductor material.

The insulating film 118 may surround outer surfaces (e.g., outer peripheral surfaces) of the semiconductor layers 111 and 113 and the electrode layers 117. In some embodiments, the insulating film 118 may expose at least a part of the outer surface of the electrode layer 117 so that the electrode layer 117 may be electrically connected to an electrode (e.g., AE or CE) or a contact electrode CTE. The insulating film 118 may surround an outer surface (e.g., an outer peripheral surface) of the active layer 115 and extend in the direction in which the light emitting diode ED extends. The insulating film 118 may protect the light emitting diode ED. For example, the insulating film 118 may surround side surfaces of the light emitting diode ED and expose both ends of the light emitting diode ED in the longitudinal direction.

The insulating film 118 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$). Therefore, the insulating film 118 may prevent an electrical short circuit that may occur when the active layer 115 directly contacts an electrode through which an electrical signal is transmitted to the light emitting diode ED. In addition, the insulating film 118 may prevent a reduction in luminous efficiency by protecting the outer surface (e.g., an outer peripheral surface) of the light emitting diode ED including the active layer 115.

Figure 7:
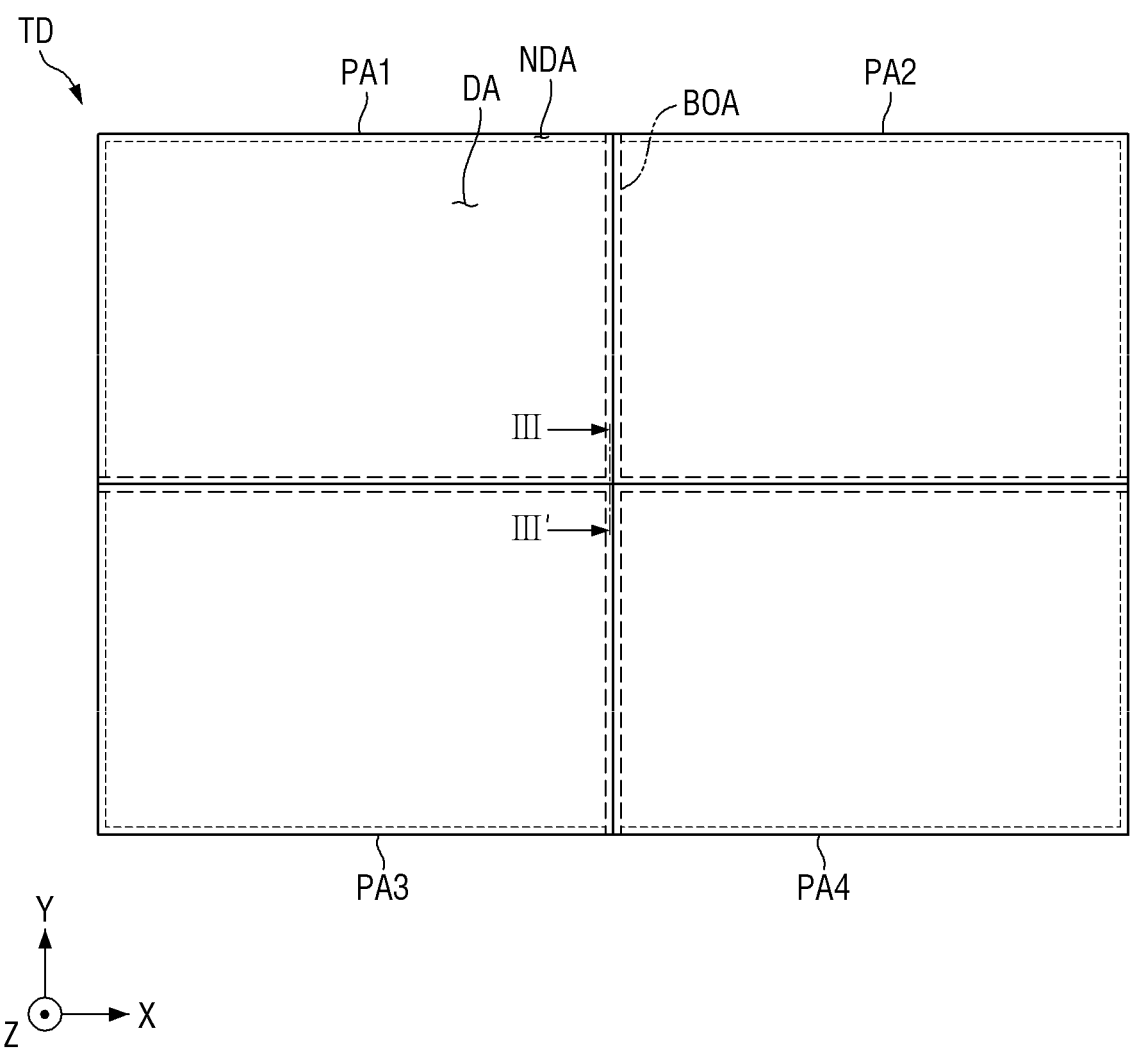
FIG. 7 is a plan view illustrating a coupling structure of a tiled display device according to an embodiment.
Figure 8:
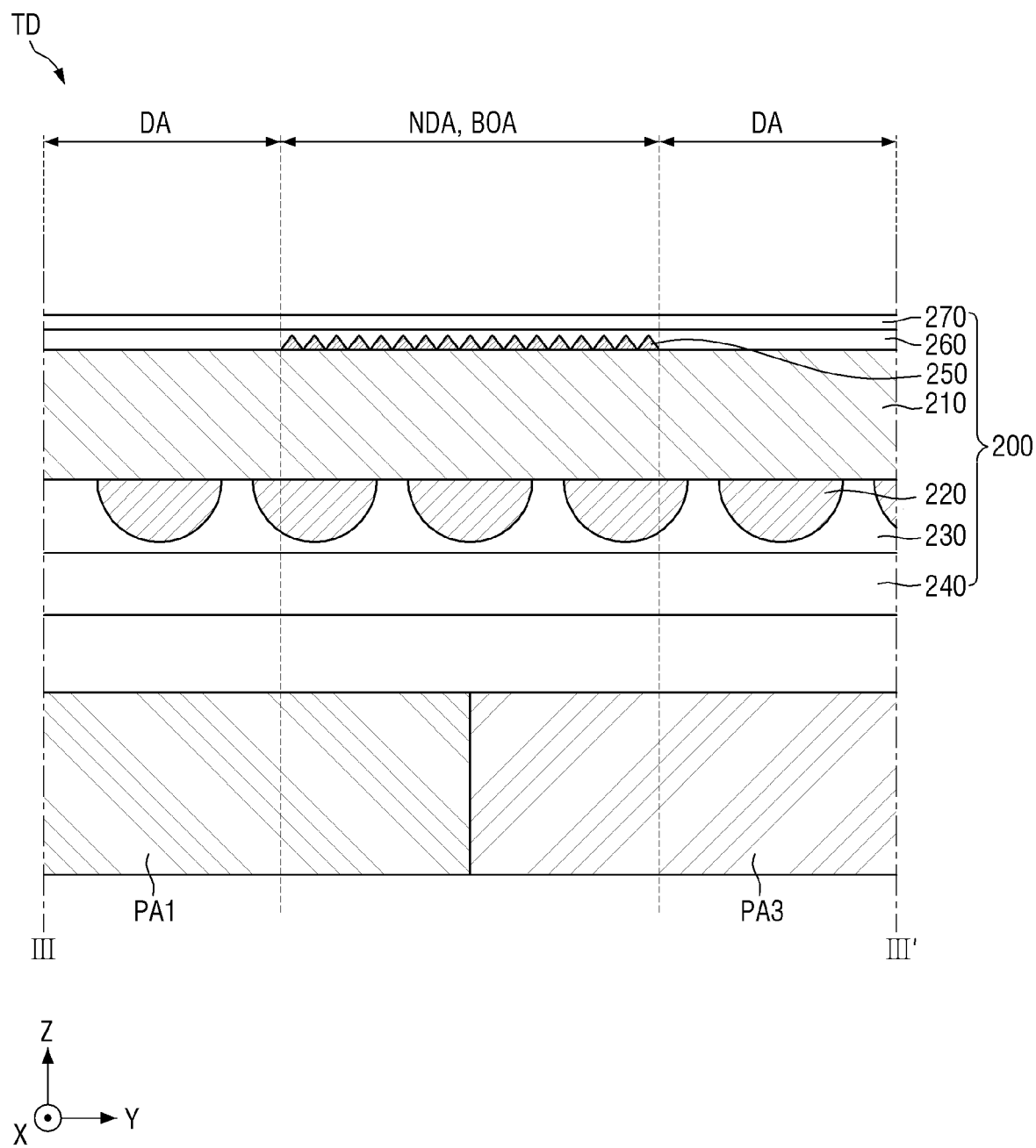
FIG. 8 is a cross-sectional view taken along the line III-III' of FIG. 7.
Figure 9:
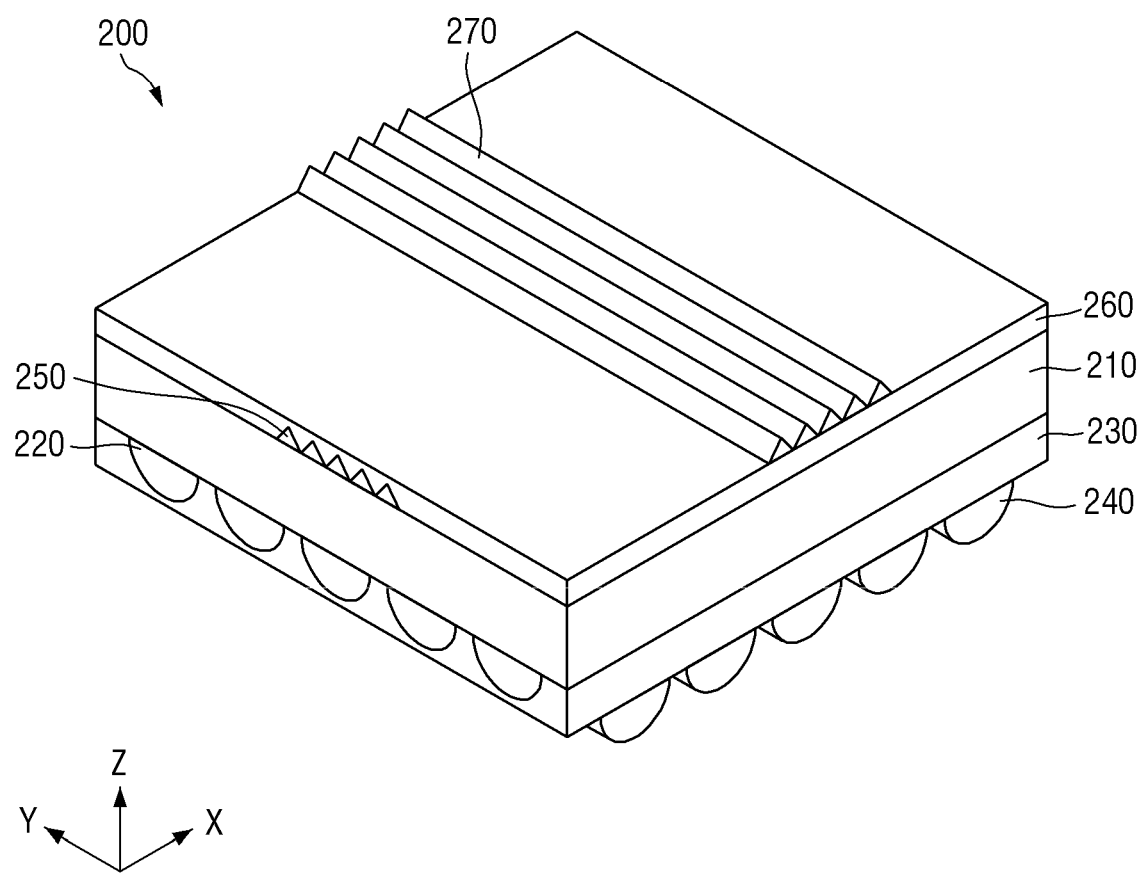
FIG. 9 is a schematic perspective view of an optical member according to an embodiment.

FIG. 7 is a plan view illustrating a coupling structure of a tiled display device TD according to an embodiment. FIG. 8 is a cross-sectional view taken along the line III-III' of FIG. 7. FIG. 9 is a schematic perspective view of an optical member 200 according to an embodiment.

Referring to FIG. 7, the tiled display device TD according to an embodiment may include a plurality of display devices PA1, PA2, PA3, and PA4. For example, the tiled display device TD may include a first display device PA1, a second display device PA2, a third display device PA3, and a fourth display device PA4. However, the number of display devices PA1, PA2, PA3, and PA4 is not limited to the embodiment of FIG. 7. The number of display devices may be variously adjusted according to the size of the tiled display device TD. Although a total of four display devices in a 2×2 array are illustrated in FIG. 7, the present disclosure is not limited thereto. For example, a plurality of display devices in a 3×3 array or a 4×4 or more array may also be included.

Each of the display devices PA1, PA2, PA3, and PA4 may be shaped like a rectangle including long sides and short sides. Each long side of each of the display devices PA1, PA2, PA3, and PA4 may extend in the first direction (X-axis direction), and each short side of each of the display devices PA1, PA2, PA3, and PA4 may extend in the second direction (Y-axis direction). The long sides and short sides of the display devices PA1, PA2, PA3, and PA4 may be disposed adjacent to each other or may contact each other.

Each of the display devices PA1, PA2, PA3, and PA4 may include a display area DA and a non-display area NDA surrounding the display area DA along the edge or periphery of the display area DA. The non-display area NDA may include a boundary area BOA in which the display devices PA1, PA2, PA3, and PA4 are adjacent to each other. In FIG. 7, the boundary area BOA is illustrated as being wider than the non-display area NDA. However, this is only to prevent confusion between the boundary area BOA and the non-display area NDA. A width of the boundary area BOA may actually be equal to or smaller than the sum of widths of adjacent non-display areas NDA.

Referring to FIGS. 8 and 9, the tiled display device TD may include the optical member 200 disposed on the first display device PA1 and the third display device PA3 adjacent to each other. The optical member 200 is designed to improve optical characteristics of the tiled display device TD and may improve luminance of the non-display area NDA including the boundary area BOA. The optical member 200 may have a size equal to or larger than the combined size of the display devices PA1, PA2, PA3, and PA4.

In an embodiment, the optical member 200 may include a base substrate 210, a plurality of first lenticular lenses 220 disposed on a surface of the base substrate 210, a first lower planarization layer 230 disposed under the first lenticular lenses 220, a plurality of second lenticular lenses 240 disposed under the first lower planarization layer 230, a plurality of first prism patterns 250 disposed on the other surface of the base substrate 210, a first upper planarization layer 260 disposed on the first prism patterns 250, and a plurality of second prism patterns 270 disposed on the first upper planarization layer 260.

The base substrate 210 may be a base which supports the optical member 200 and on and/or under which patterns such as lenses may be formed. The base substrate 210 may be made of an insulating material such as a transparent polymer resin or glass that can transmit light. For example, the base substrate 210 may include polyethylene terephthalate (PET), polymethyl methacrylate (PMMA), polycarbonate (PC), polypropylene (PP), polyethylene (PE), polystyrene (PS), or a mixture of the same.

The base substrate 210 may have a thickness of 100 to 250 μm. The base substrate 210 having a thickness of 100 μm or more may secure mechanical properties and thermal resistance of the optical member 200. The base substrate 210 having a thickness of 250 μm or less may make the optical member 200 thin. The base substrate 210 may be composed of a single layer. However, the present disclosure is not limited thereto, and the base substrate 210 may also be composed of a plurality of layers.

The first lenticular lenses 220 may be disposed on a surface, e.g., a lower surface of the base substrate 210. The first lenticular lenses 220 may diffuse incident light to the surroundings by refracting the incident light. In an embodiment, the first lenticular lenses 220 may diffuse light incident from the display area DA to the non-display area NDA including the boundary area BOA by refracting the incident light, thereby improving the luminance of the non-display area NDA.

The first lenticular lenses 220 may be made of a transparent polymer resin. The first lenticular lenses 220 may include any one of, for example, polyethylene terephthalate (PET), polymethyl methacrylate (PMMA), polycarbonate (PC), polypropylene (PP), polyethylene (PE), and polystyrene (PS). The first lenticular lenses 220 may have a semicircular cross-sectional shape and may extend in the longitudinal direction, e.g., the first direction (X-axis direction). The first lenticular lenses 220 may be disposed at regular intervals.

The first lower planarization layer 230 may be disposed on a surface, e.g., the lower surface of the base substrate 210 and may cover the first lenticular lenses 220. The first lower planarization layer 230 may planarize surfaces of the first lenticular lenses 220 by covering the first lenticular lenses 220.

The first lower planarization layer 230 may be made of an insulating material such as a transparent polymer resin or glass that can transmit light. For example, the first lower planarization layer 230 may include any one of polyethylene terephthalate (PET), polymethyl methacrylate (PMMA), polycarbonate (PC), polypropylene (PP), polyethylene (PE), and polystyrene (PS). The first lower planarization layer 230 is thick enough to planarize the surfaces of the first lenticular lenses 220 by covering the first lenticular lenses 220 and is not particularly limited.

The second lenticular lenses 240 may be disposed under the first lower planarization layer 230. The second lenticular lenses 240 may diffuse incident light to the surroundings by refracting the incident light and may extend in the second direction (Y-axis direction) crossing the first direction (X-axis direction). The first lenticular lenses 220 described above and the second lenticular lenses 240 may extend in directions crossing each other to uniformly diffuse light emitted from the display devices PA1, PA2, PA3, and PA4 in all directions. The first direction (X-axis direction) in which the first lenticular lenses 220 extend and the second direction (Y-axis direction) in which the second lenticular lenses 240 extend may perpendicularly cross each other. The structure and material of the second lenticular lenses 240 are the same as those of the first lenticular lenses 220 described above, and thus a detailed description thereof will be omitted.

The first prism patterns 250 may be disposed on the other surface of the base substrate 210, for example, an upper surface of the base substrate 210. The first prism patterns 250 may concentrate light passing through the base substrate 210 in an upward direction. The first prism patterns 250 may have a triangular cross-sectional shape and may extend along the first direction (X-axis direction). The first prism patterns 250 may be shaped like, e.g., triangular prism bars. The first prism patterns 250 may contact each other.

The first prism patterns 250 may be made of a transparent polymer resin that can transmit light. For example, the first prism patterns 250 may include polyethylene terephthalate (PET), polymethyl methacrylate (PMMA), polycarbonate (PC), polypropylene (PP), polyethylene (PE), polystyrene (PS), or a mixture of the same.

The first prism patterns 250 may extend in the first direction (X-axis direction) and may extend in parallel in the same direction as the first lenticular lenses 220. The first prism patterns 250 may overlap the boundary area BOA and extend parallel to the longitudinal direction of the boundary area BOA, thereby improving the luminance of the boundary area BOA of the tiled display device TD.

The first upper planarization layer 260 may be disposed on a surface, e.g., the upper surface of the base substrate 210 and may cover the first prism patterns 250. The first upper planarization layer 260 may planarize surfaces of the first prism patterns 250 by covering the first prism patterns 250. The first upper planarization layer 260 may be made of an insulating material such as a transparent polymer resin or glass that can transmit light. For example, the first upper planarization layer 260 may include any one of polyethylene terephthalate (PET), polymethyl methacrylate (PMMA), polycarbonate (PC), polypropylene (PP), polyethylene (PE), and polystyrene (PS). The first upper planarization layer 260 is thick enough to planarize the surfaces of the first prism patterns 250 by covering the first prism patterns 250 and is not particularly limited.

The second prism patterns 270 may be disposed on the first upper planarization layer 260. The second prism patterns 270 may concentrate incident light and may extend in the second direction (Y-axis direction) crossing the first direction (X-axis direction). The first prism patterns 250 described above and the second prism patterns 270 may extend in directions crossing each other to concentrate light transmitted through the boundary area BOA extending in the second direction (Y-axis direction). The first direction (X-axis direction) in which the first prism patterns 250 extend and the second direction (Y-axis direction) in which the second prism patterns 270 extend may perpendicularly cross each other. The structure and material of the second prism patterns 270 are the same as those of the first prism patterns 250 described above, and thus a detailed description thereof will be omitted.

The optical member 200 according to the above-described embodiment will now be described in more detail.

Figure 10:
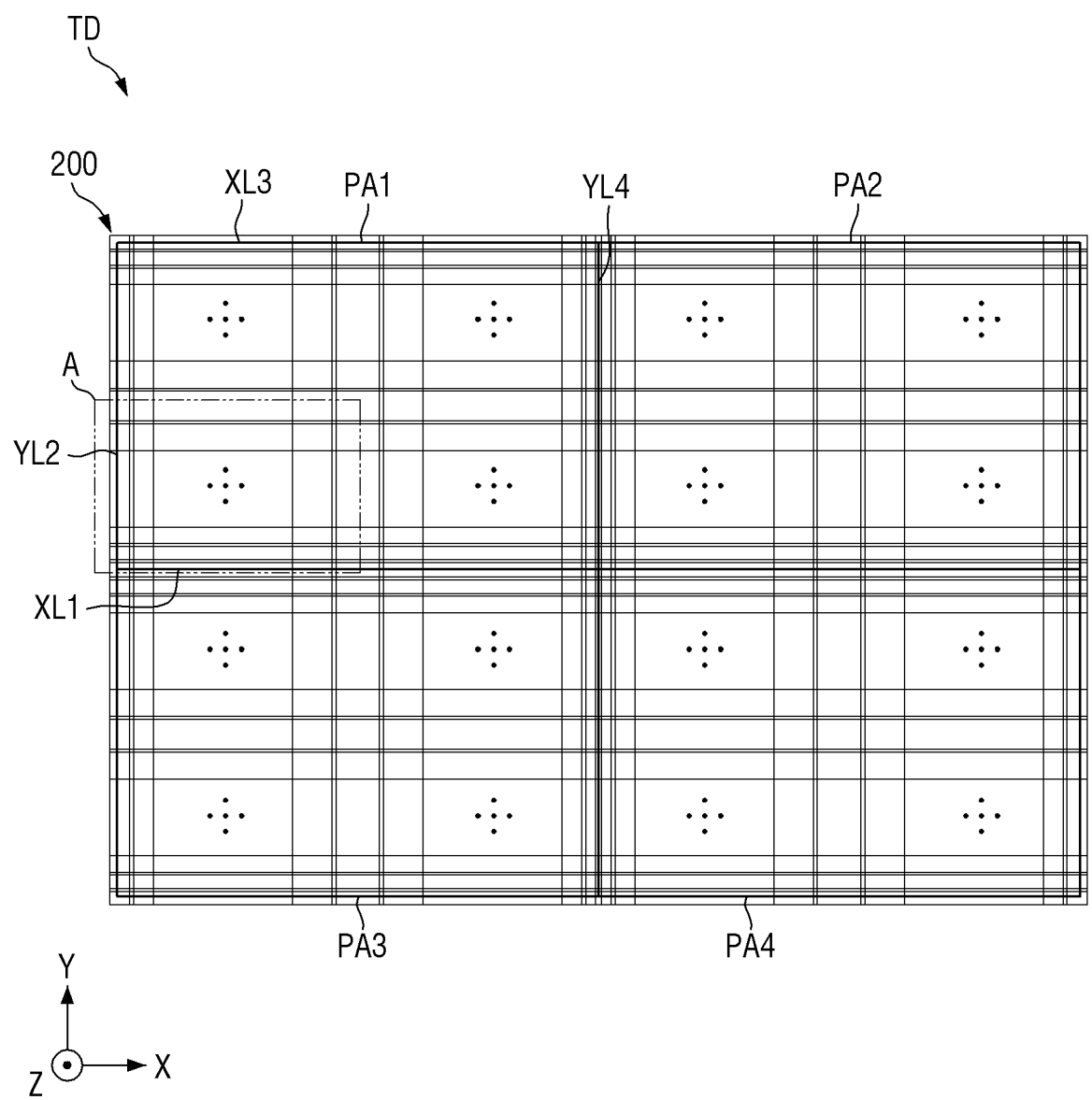
FIG. 10 is a plan view of a bottom surface of the optical member of FIG. 9 according to an embodiment.
Figure 11:
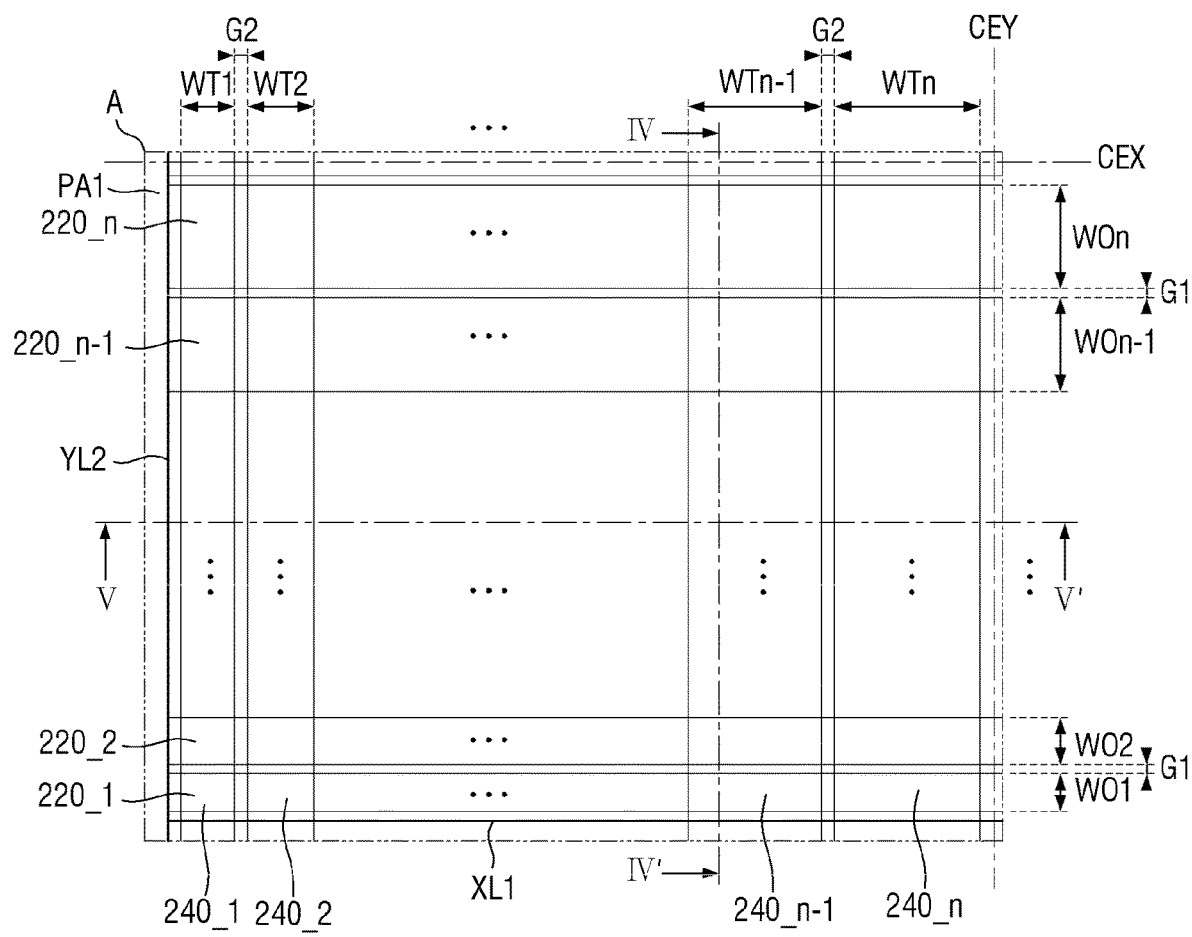
FIG. 11 is a schematic enlarged view of area A of FIG. 10.
Figure 12:
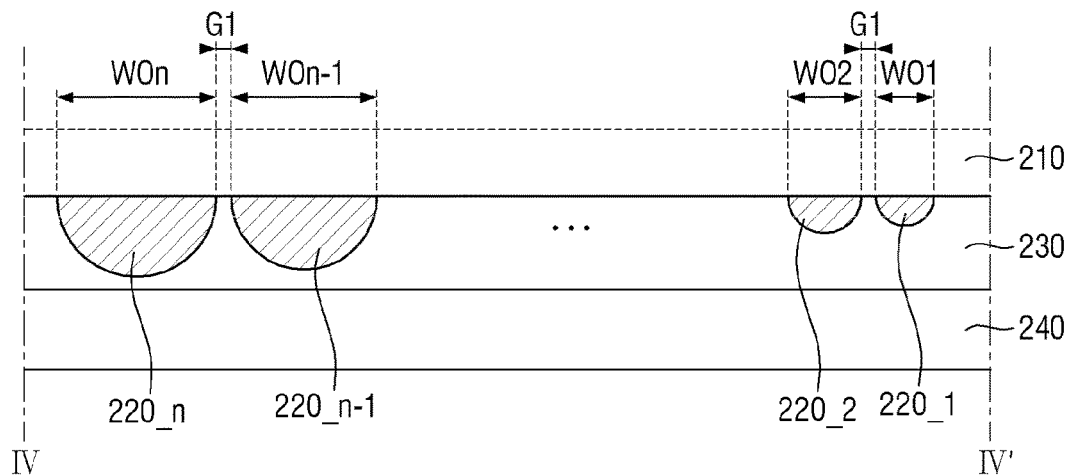
FIG. 12 is a cross-sectional view taken along the line IV-IV' of FIG. 11.
Figure 12:
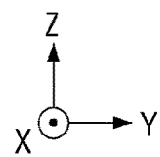
Figure 13:
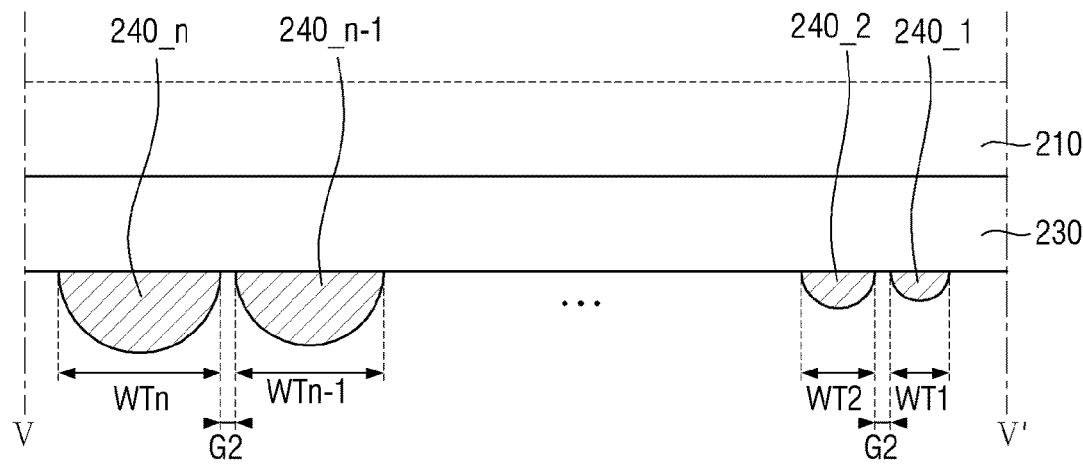
FIG. 13 is a cross-sectional view taken along the line V-V' of FIG. 11.
Figure 13:
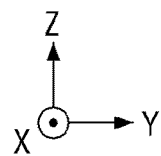

FIG. 10 is a plan view of a bottom surface of the optical member 200 according to the embodiment of FIG. 9. FIG. 11 is a schematic enlarged view of area A of FIG. 10. FIG. 12 is a cross-sectional view taken along the line IV-IV' of FIG. 11. FIG. 13 is a cross-sectional view taken along the line V-V' of FIG. 11.

It should be noted that the first lenticular lenses 220 and the second lenticular lenses 240 are mainly illustrated in FIGS. 10-13 to describe the structures of the first lenticular lenses 220 and the second lenticular lenses 240 of the optical member 200.

Referring to FIGS. 10-13, the optical member 200 according to the embodiment may be disposed on the display devices PA1, PA2, PA3, and PA4. The size of the optical member 200 may be larger than the combined size of the display devices PA1, PA2, PA3, and PA4 so that the optical member 200 can cover the display devices PA1, PA2, PA3, and PA4.

The optical member 200 may include the first lenticular lenses 220 extending in the first direction (X-axis direction) and the second lenticular lenses 240 extending in the second direction (Y-axis direction). The first lenticular lenses 220 may extend from one side of the base substrate 210 extending in the second direction (Y-axis direction) to the other side that is opposite (or facing) the one side. The second lenticular lenses 240 may extend from one side of the base substrate 210 extending in the first direction (X-axis direction) to the other side that is opposite (or facing) the one side.

The display devices PA1, PA2, PA3, and PA4 may be disposed under the optical member 200, and the first lenticular lenses 220 and the second lenticular lenses 240 may overlap the display devices PA1, PA2, PA3, and PA4. The first lenticular lenses 220 may extend in the first direction (X-axis direction) from one side extending in the second direction (Y-axis direction) of the display devices PA1, PA2, PA3 and PA4 to the other side that is opposite (or facing) the one side. The second lenticular lenses 240 may extend in the second direction (Y-axis direction) from one side extending in the first direction (X-axis direction) of the display devices PA1, PA2, PA3, and PA4 to the other side that is opposite (or facing) the one side.

In an embodiment, widths of the first lenticular lenses 220 may increase from a side extending in the first direction (X-axis direction) toward the middle in each of the display devices PA1, PA2, PA3, and PA4. For example, the widths of the first lenticular lenses 220 may be variable.

The first display device PA1 may include a first side XL1 extending in the first direction (X-axis direction) and a second side YL2 extending in the second direction (Y-axis direction). The first display device PA1 may include a first center line CEX (see, e.g., FIG. 17) bisecting, in the first direction (X-axis direction), a width of the first display device PA1 in the second direction (Y-axis direction) and a second center line CEY (see, e.g., FIG. 17) bisecting, in the second direction (Y-axis direction), a width of the first display device PA1 in the first direction (X-axis direction).

The first lenticular lenses 220 may be disposed at intervals along the second direction (Y-axis direction) from the first side XL1 of the first display device PA1. Widths WO1 to WOn of the first lenticular lenses 220 may gradually increase from the first side XL1 of the first display device PA1 toward the first center line CEX. For example, a $(1\_1)^{th}$ lenticular lens 220_1 closest to the first side XL1 may have a first vertical width WO1 which is the smallest, and a $(1\_2)^{th}$ lenticular lens 220_2 that is closer to the first center line CEX than the $(1\_1)^{th}$ lenticular lens 220_1 and may have a second vertical width WO2 greater than the first vertical width WO1. The widths of the first lenticular lenses 220 may gradually increase as the distance to the first center line CEX decreases. A $(1\_n)^{th}$ lenticular lens 220_n closest to the first center line CEX may have an $n^{th}$ vertical width WOn which is the largest, and a $(1\_n-1)^{th}$ lenticular lens 220_n-1 next to the $(1\_n)^{th}$ lenticular lens 220_n but disposed in a direction facing the first side XL1 may have an $(n-1)^{th}$ vertical width WOn-1 smaller than the $n^{th}$ vertical width WOn.

Likewise, the widths of the first lenticular lenses 220 may gradually increase from a third side XL3 facing the first side XL1 of the first display device PA1 toward the first center line CEX. That is, the first lenticular lenses 220 may be symmetrical to each other with respect to the first center line CEX of the first display device PA1.

When the vertical widths WO1 to WOn of the first lenticular lenses 220 gradually increase from the first side XL1 of the first display device PA1 toward the first center line CEX, diffusion characteristics of the first lenticular lenses 220 may gradually decrease from the first side XL1 of the first display device PA1 toward the first center line CEX.

The first lenticular lenses 220 may be spaced from each other by equal distances. For example, the first lenticular lenses 220 may be spaced from each other by the same first gap G1.

A ratio of the width WO of a first lenticular lens 220 to the first gap G1 between the first lenticular lenses 220 may be in the range of 4:1 to 12:1. When the ratio of the width WO of the first lenticular lens 220 to the first gap G1 between the first lenticular lenses 220 gradually increases from 4:1 to 12:1 from a side extending in the first direction (X-axis direction) toward the middle in each of the display devices PA1, PA2, PA3, and PA4, the luminance of the boundary area BOA can be improved, and a reduction in the luminance of the display area DA can be prevented.

The tiled display device TD may improve the low luminance of the boundary area BOA by diffusing light of the display area DA. To this end, a first lenticular lens 220 adjacent to the first side XL1 overlapping the boundary area BOA of the first display device PA1 may be formed to have the smallest width, thereby increasing light diffusion characteristics. In addition, the tiled display device TD may prevent a reduction in the luminance of the display area DA due to diffusion of light. To this end, the widths of the first lenticular lenses 220 may be increased as the distance to the first center line CEX of the first display device PA1 decreases. This may reduce the light diffusion characteristics, thereby preventing a reduction in luminance.

The first lenticular lenses 220 described above may extend not only on the first display device PA1 but also on the second display device PA2. Therefore, the first lenticular lenses 220 of the second display device PA2 may have the same structure as the first lenticular lenses 220 of the first display device PA1. In addition, the first lenticular lenses 220 of the third display device PA3 and the fourth display device PA4 may have the same structure as the first lenticular lenses 220 of the first display device PA1.

In an embodiment, widths of the second lenticular lenses 240 may increase from a side extending in the second direction (Y-axis direction) toward the middle in each of the display devices PA1, PA2, PA3, and PA4.

Referring to FIGS. 11 and 13, the first display device PA1 may include the second side YL2 extending in the second direction (Y-axis direction) and may include the second center line CEY bisecting, in the second direction (Y-axis direction), the width of the first display device PA1 in the first direction (X-axis direction).

The second lenticular lenses 240 may be disposed at intervals along the first direction (X-axis direction) from the second side YL2 of the first display device PA1. Widths WT1 to WTn of the second lenticular lenses 240 may gradually increase from the second side YL2 of the first display device PA1 toward the second center line CEY. For example, a $(2\_1)^{th}$ lenticular lens 240_1 closest to the second side YL2 may have a first horizontal width WT1 which is the smallest, and a $(2\_2)^{th}$ lenticular lens 240_2 closer to the second center line CEY than the $(2\_1)^{th}$ lenticular lens 240_1 may have a second horizontal width WT2 greater than the first horizontal width WT1. The widths of the second lenticular lenses 240 may gradually increase as the distance to the second center line CEY decreases. A $(2\_n)^{th}$ lenticular lens 240_$n$ closest to the second center line CEY may have an $n^{th}$ horizontal width WTn which is the largest, and a $(2\_n-1)^{th}$ lenticular lens 240_$n$-1 next to the $(2\_n)^{th}$ lenticular lens 240_$n$ but disposed in a direction facing the second side YL2 may have an $(n-1)^{th}$ horizontal width WTn-1 smaller than the $n^{th}$ horizontal width WTn.

Likewise, the widths of the second lenticular lenses 240 may gradually increase from a fourth side YL4 facing the second side YL2 of the first display device PA1 toward the second center line CEY. That is, the second lenticular lenses 240 may be symmetrical to each other with respect to the second center line CEY of the first display device PA1.

When the widths WT1 to WTn of the second lenticular lenses 240 gradually increase from the second side YL2 of the first display device PA1 toward the second center line CEY, diffusion characteristics of the second lenticular lenses 240 may gradually decrease from the second side YL2 of the first display device PA1 toward the second center line CEY.

The second lenticular lenses 240 may be spaced from each other by equal distances. For example, the second lenticular lenses 240 may be spaced from each other by the same second gap G2. The second gap G2 between the second lenticular lenses 240 may be the same as the first gap G1 between the first lenticular lenses 220.

A ratio of the width WT of a second lenticular lens 240 to the second gap G2 between the second lenticular lenses 240 may be in the range of 4:1 to 12:1. For example, when the ratio of the width WT of the second lenticular lens 240 to the second gap G2 between the second lenticular lenses 240 gradually increases from 4:1 to 12:1 from a side extending in the second direction (Y-axis direction) toward the middle in each of the display devices PA1, PA2, PA3, and PA4, the luminance of the boundary area BOA may be improved, and a reduction in the luminance of the display area DA can be prevented.

Like the first lenticular lenses 220 described above, a second lenticular lens 240 adjacent to the second side YL2 overlapping the boundary area BOA of the first display device PA1 may be formed to have the smallest width, thereby increasing light diffusion characteristics. In addition, the widths of the second lenticular lenses 240 may be increased as the distance to the second center line CEY of the first display device PA1 decreases. This may reduce the light diffusion characteristics, thereby preventing a reduction in luminance.

The second lenticular lenses 240 described above may extend not only on the first display device PA1 but also on the third display device PA3. Therefore, the second lenticular lenses 240 of the third display device PA3 may have the same structure as the second lenticular lenses 240 of the first display device PA1. In addition, the second lenticular lenses 240 of the second display device PA2 and the fourth display device PA4 may have the same structure as the second lenticular lenses 240 of the first display device PA1.

Figure 14:
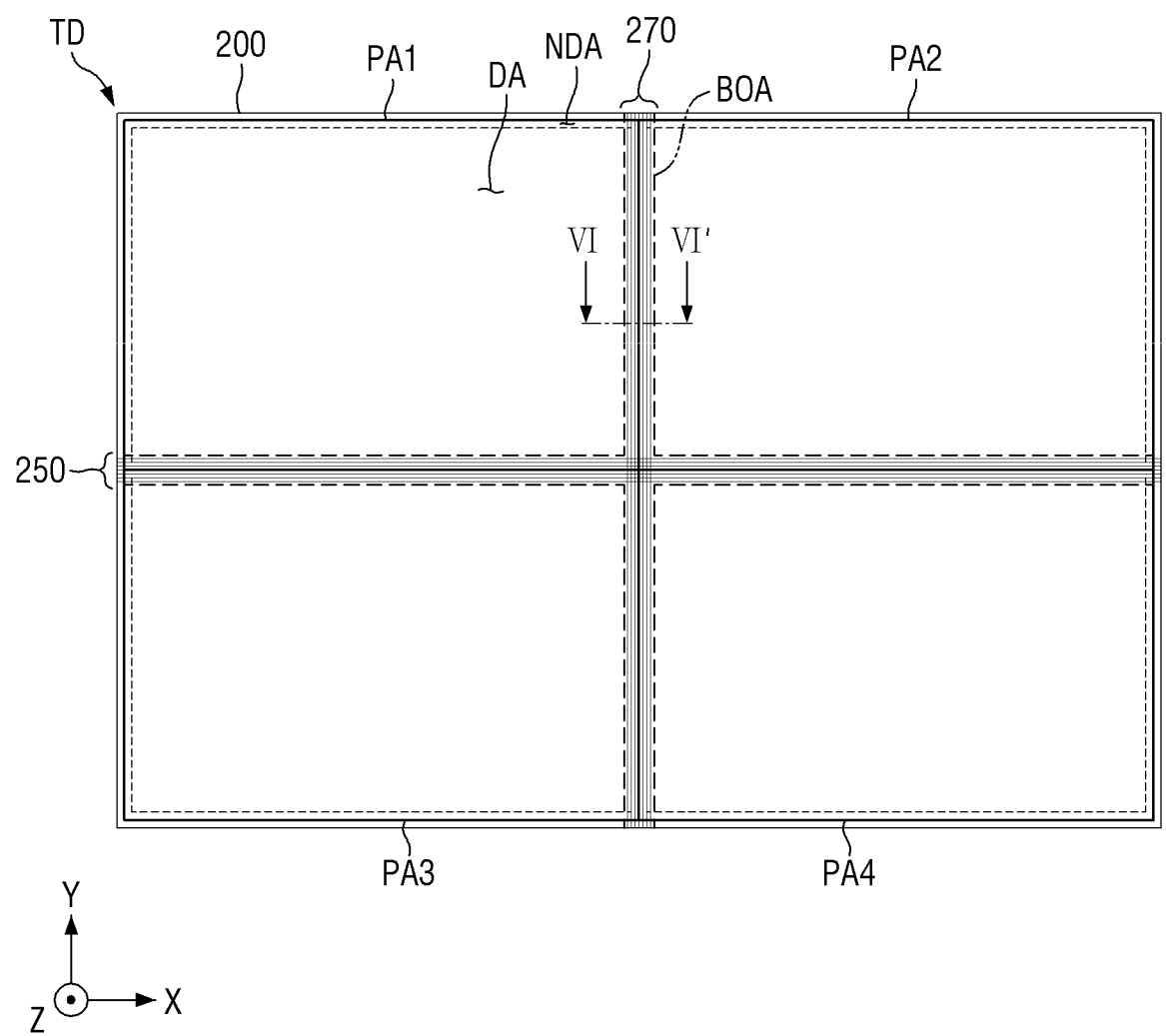
FIG. 14 is a plan view of the optical member of FIG. 9 according to an embodiment.

FIG. 14 is a plan view of the optical member 200 of FIG. 9 according to an embodiment.

It should be noted that the first prism patterns 250 and the second prism patterns 270 are mainly illustrated in FIG. 14 to describe the structures of the first prism patterns 250 and the second prism patterns 270 of the optical member 200.

Referring to FIG. 14 in conjunction with FIGS. 8 and 9, the optical member 200 according to the described embodiment may be disposed on the display devices PA1, PA2, PA3, and PA4. The size of the optical member 200 may be larger than the combined size of the display devices PA1, PA2, PA3, and PA4 so that the optical member 200 can cover the display devices PA1, PA2, PA3, and PA4.

The optical member 200 may include the first prism patterns 250 disposed on the upper surface of the base substrate 210, the first upper planarization layer 260 disposed on the first prism patterns 250 to cover the first prism patterns 250, and the second prism patterns 270 disposed on the first upper planarization layer 260.

The optical member 200 may include the first prism patterns 250 extending in the first direction (X-axis direction) and the second prism patterns 270 extending in the second direction (Y-axis direction). The first prism patterns 250 may overlap the boundary area BOA of the tiled display device TD extending in the first direction (X-axis direction) and extend from one side of the base substrate 210 extending in the second direction (Y-axis direction) to the other side facing the one side. The second prism patterns 270 may overlap the boundary area BOA of the tiled display device TD extending in the second direction (Y-axis direction) and extend from one side of the base substrate 210 extending in the first direction (X-axis direction) to the other side facing the one side.

The display devices PA1, PA2, PA3, and PA4 may be disposed under the optical member 200, and the first prism patterns 250 and the second prism patterns 270 may overlap the display devices PA1, PA2, PA3 and PA4. In an embodiment, the first prism patterns 250 and the second prism patterns 270 may have the same width. The first prism patterns 250 and the second prism patterns 270 may concentrate light diffused to the boundary area BOA in the upward direction, thereby improving the luminance of the boundary area BOA. The first prism patterns 250 and the second prism patterns 270 may have the same width to ensure uniformity of luminance improvement. In addition, the first prism patterns 250 may contact each other, and the second prism patterns 270 may contact each other.

Figure 15:
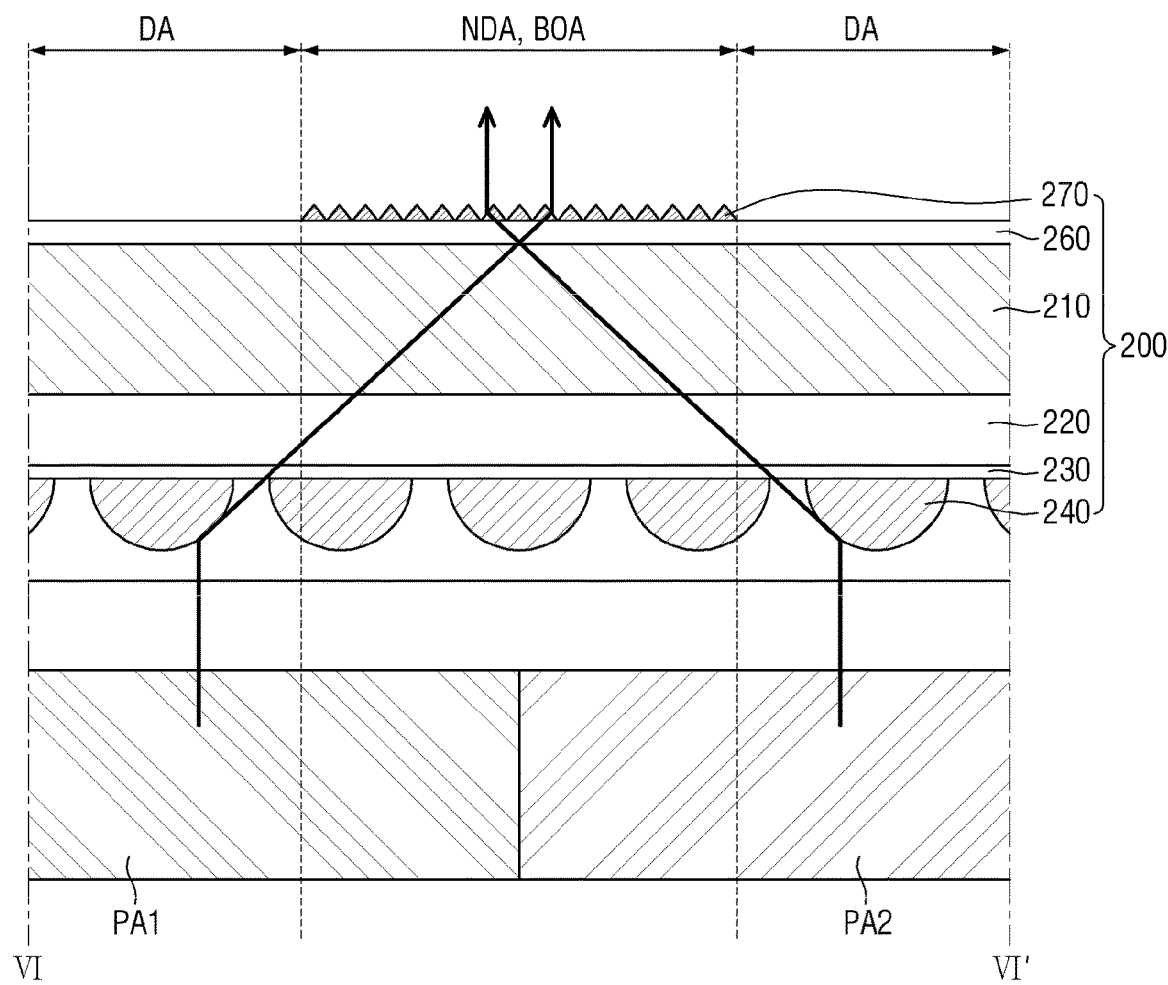
FIG. 15 is a cross-sectional view taken along the line VI-VI' of FIG. 14.

FIG. 15 is a cross-sectional view taken along the line VI-VI' of FIG. 14.

The cross-sectional structure of the boundary area BOA of the tiled display device TD which extends in the second direction (Y-axis direction) will now be described with reference to FIG. 15.

The boundary area BOA extending in the second direction (Y-axis direction) may be disposed between the first display device PA1 and the second display device PA2. The boundary area BOA may be included in the non-display area NDA of each of the first display device PA1 and the second display device PA2.

The optical member 200 may be disposed on the first display device PA1 and the second display device PA2. The first upper planarization layer 260 may be disposed on the base substrate 210 overlapping the boundary area BOA, and the second prism patterns 270 extending in the second direction (Y-axis direction) may be disposed at the boundary area BOA on the first upper planarization layer 260. In the cross-sectional view of FIG. 15, the first prism patterns 250 are not disposed at the boundary area BOA extending in the second direction (Y-axis direction). Because the first prism patterns 250 overlap the boundary area BOA extending in the first direction (X-axis direction) as described above, they may not overlap the boundary area BOA extending in the second direction (Y-axis direction).

The first lenticular lenses 220 extending in the first direction (X-axis direction) may be disposed under the base substrate 210, the first lower planarization layer 230 may be disposed under the first lenticular lenses 220, and the second lenticular lenses 240 extending in the second direction (Y-axis direction) may be disposed under the first lower planarization layer 230. The extending directions of the second prism patterns 270 and the second lenticular lenses 240 may be the same, that is, may be the second direction (Y-axis direction).

Light diffused by the first lenticular lenses 220 and the second lenticular lenses 240 in each of the first display device PA1 and the second display device PA2 adjacent to the boundary area BOA may pass through the base substrate 210 and then may be concentrated in the upward direction by the second prism patterns 270, for example, in the boundary area BOA. Accordingly, the luminance of the boundary area BOA which is lower than that of the display area DA can be improved, thus improving the problem of the boundary area BOA being visible.

Figure 16:
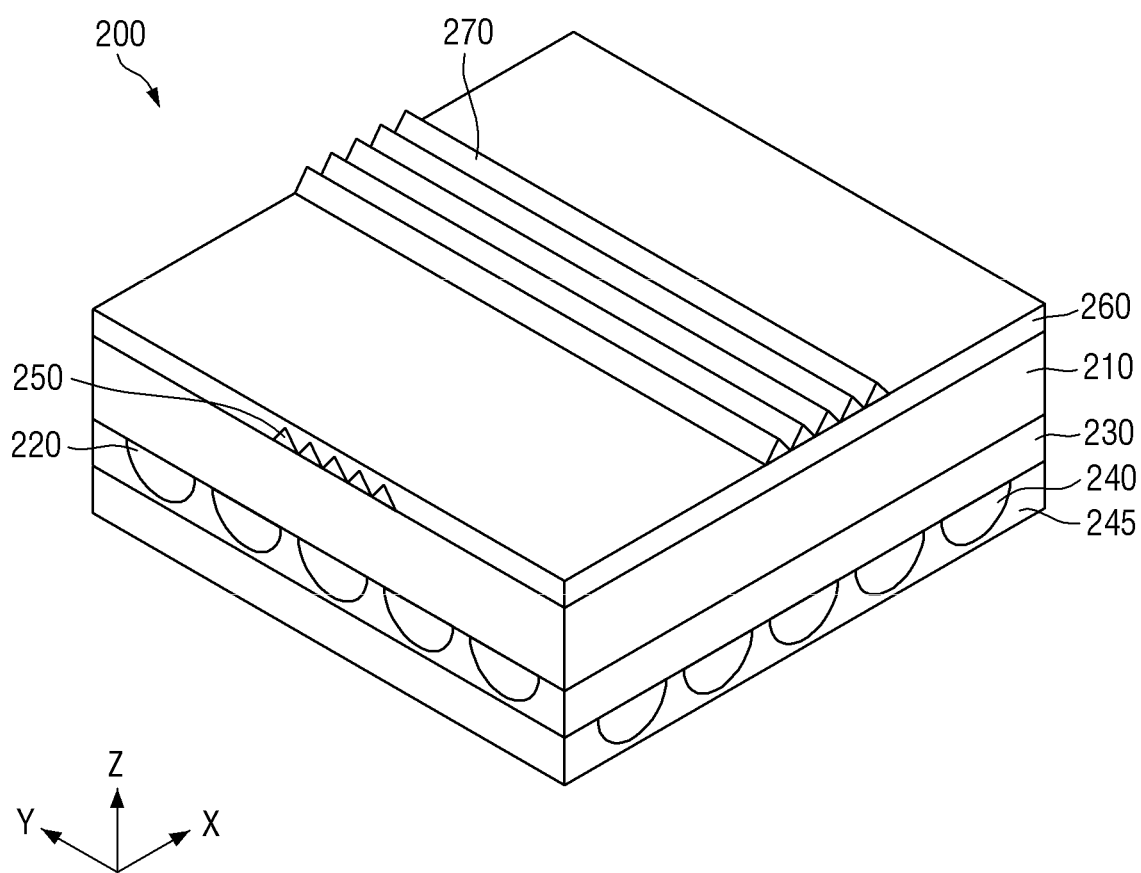
FIG. 16 is a perspective view of an optical member according to an embodiment.

FIG. 16 is a perspective view of an optical member 200 according to an embodiment.

The optical member 200 of FIG. 16 is different from the optical member 200 of FIG. 9 in that it further includes a second lower planarization layer 245. The second lower planarization layer 245 will be described below, and a description of the same elements as those described above will be omitted.

Referring to FIG. 16, the optical member 200 according to the described embodiment may further include the second lower planarization layer 245 under second lenticular lenses 240. Like a first lower planarization layer 230 described above, the second lower planarization layer 245 may cover the second lenticular lenses 240 to planarize lower surfaces of the second lenticular lenses 240.

The optical member 200 may be disposed on a plurality of display devices PA1, PA2, PA3, and PA4. The optical member 200 may be physically fixed, but may also lie on the display devices PA1, PA2, PA3, and PA4. In this case, the second lower planarization layer 245 may prevent the optical member 200 from being placed unevenly by the second lenticular lenses 240 having different sizes. For example, the optical member 200 may protrude above the display devices PA1, PA2, PA3, and PA4 in an area where a second lenticular lens 240 having a large width is disposed and may be relatively recessed in an area where a second lenticular lens 240 having a small width is disposed. Consequently, the optical member 200 may be formed uneven.

According to an embodiment, the second lower planarization layer 245 may enable the optical member 200 to be formed flat, thereby preventing light diffusion characteristics from becoming changed in an uneven area of the optical member 200.

The second lower planarization layer 245 may have a different thickness in each area of the optical member 200. For example, the second lower planarization layer 245 may have a maximum thickness between a lower surface of the first lower planarization layer 230 and a lower surface of the second lower planarization layer 245 and may have a minimum thickness between a lower surface of a second lenticular lens 240 having a large width and the lower surface of the second lower planarization layer 245. However, the present disclosure is not limited thereto.

Figure 17:
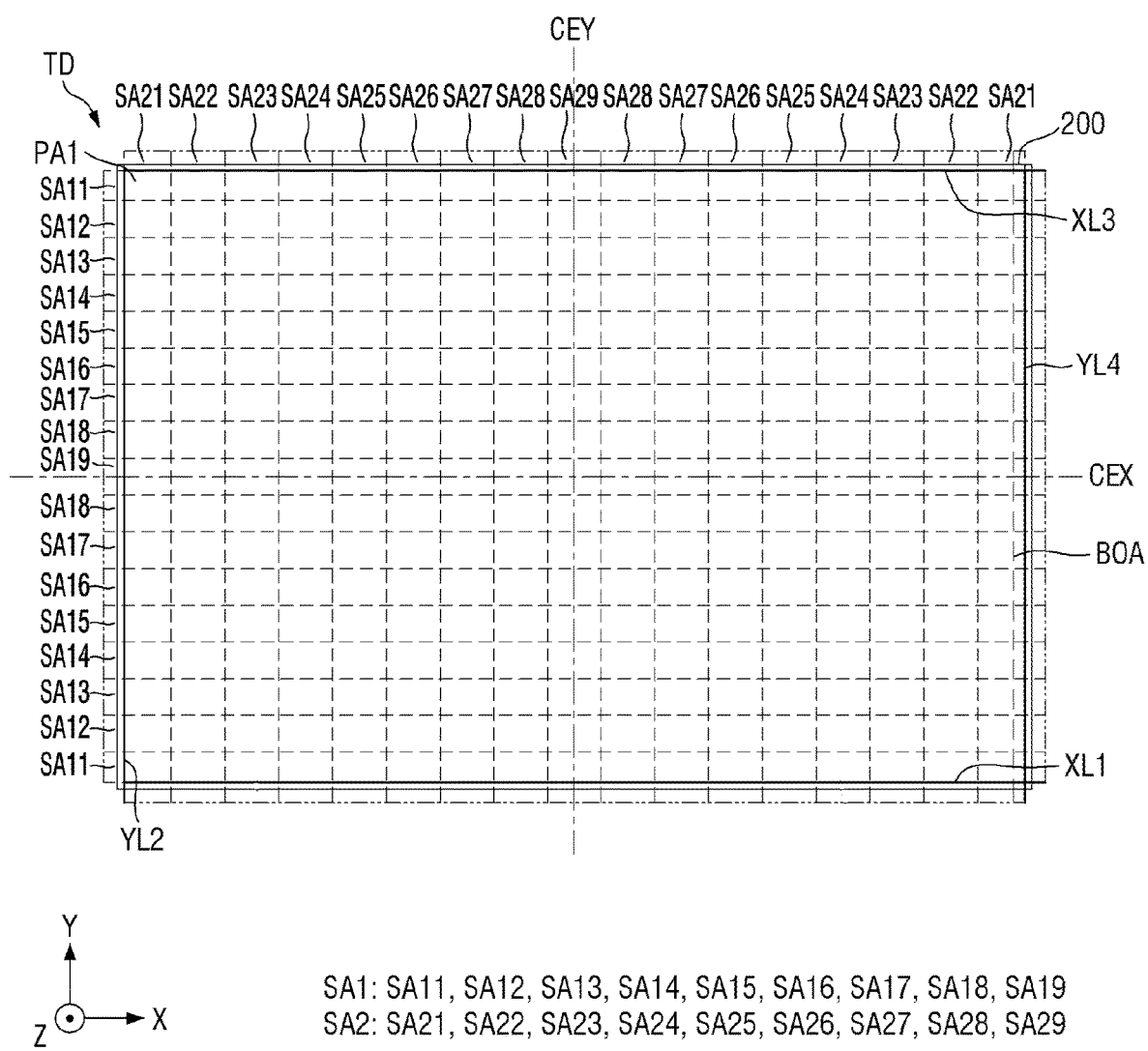
FIG. 17 is a schematic plan view of a display device according to an embodiment.
Figure 18:
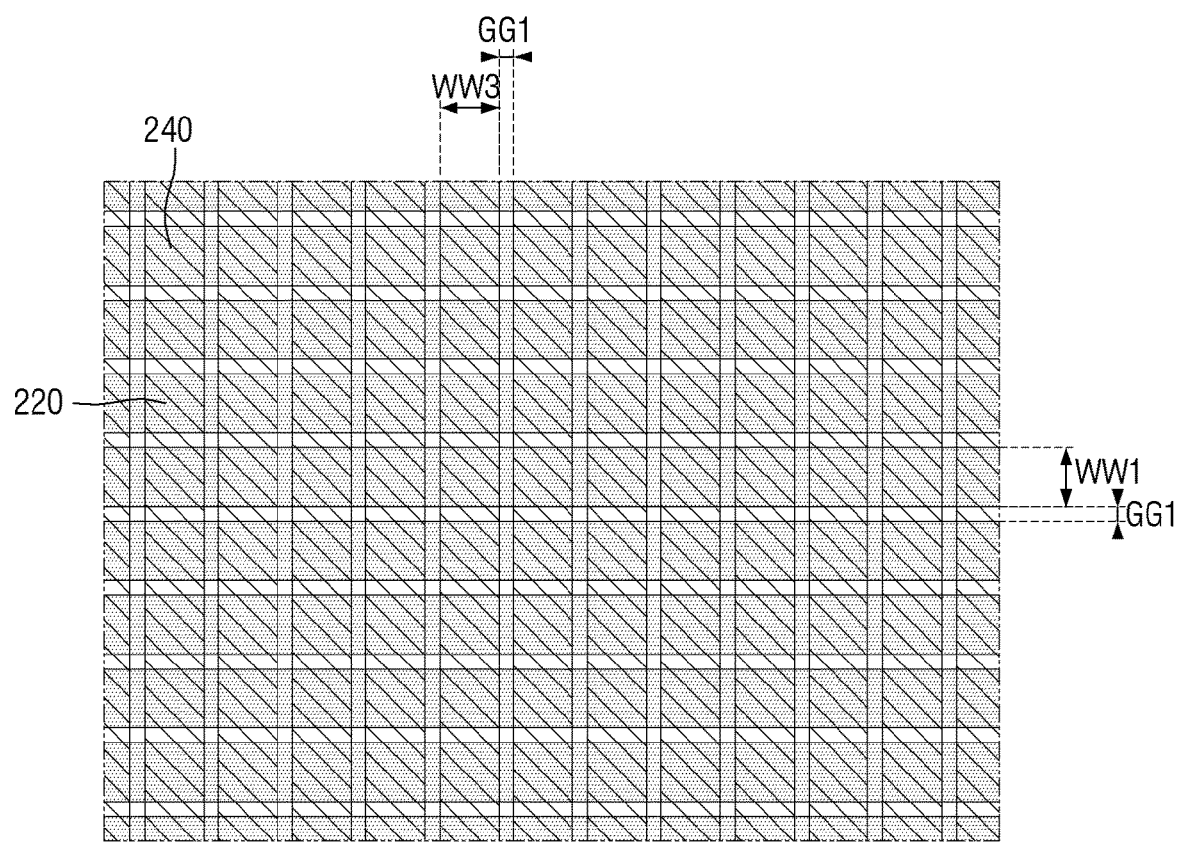
FIG. 18 is an enlarged view of area SA11 of FIG. 17.
Figure 19:
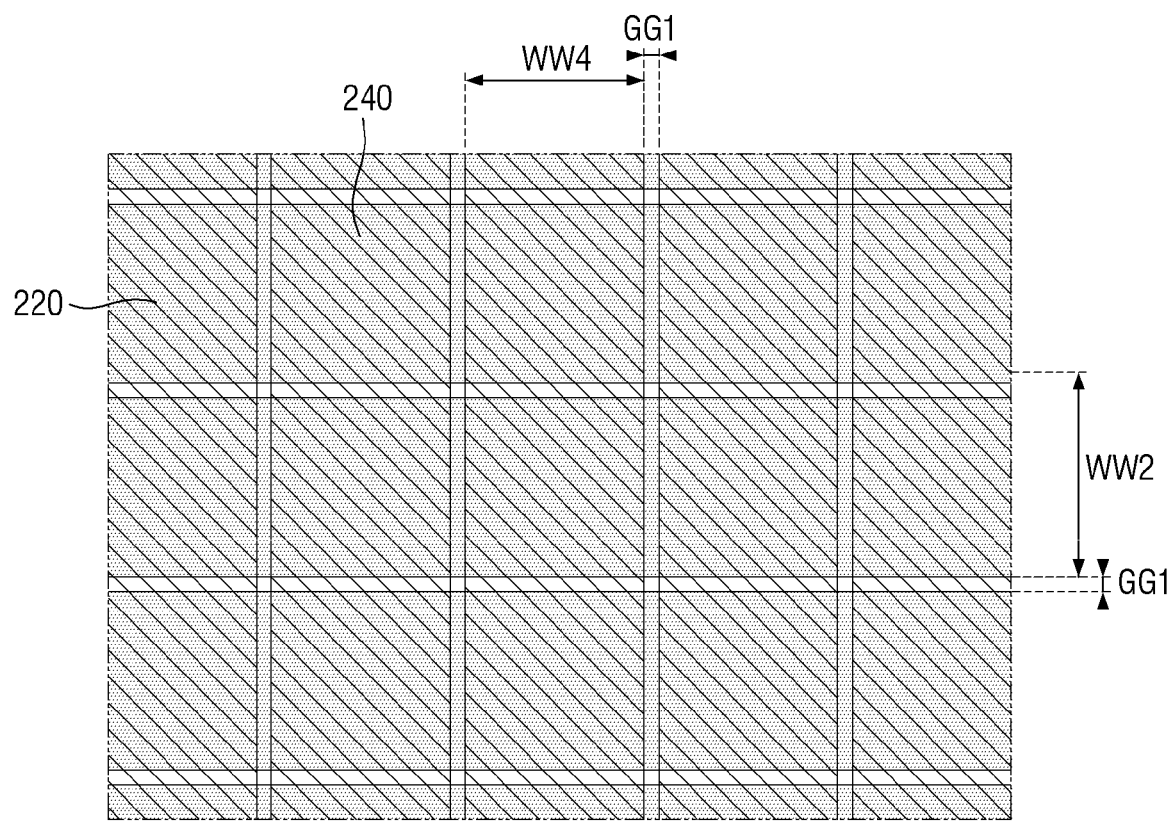
FIG. 19 is an enlarged view of area SA19 of FIG. 17.

FIG. 17 is a schematic plan view of a first display device PA1 according to an embodiment. FIG. 18 is an enlarged view of area SA11 of FIG. 17. FIG. 19 is an enlarged view of area SA19 of FIG. 17.

In the first and second lenticular lenses according to the embodiments of FIGS. 7-16 described above, a width-to-gap ratio gradually increases from 4:1 to 12:1. The embodiments of FIGS. 17-19 is different from the embodiments of FIGS. 7-16 in that the width-to-gap ratios of the first and second lenticular lenses gradually increase in units of sub areas. In the following description, a description of the same elements as those of the embodiments of FIGS. 7-16 will be omitted, and different elements will be described in detail.

Referring to FIGS. 17-19, an optical member 200 according to an embodiment may be disposed on a plurality of display devices PA1, PA2, PA3, and PA4. The size of the optical member 200 may be larger than the combined size of the display devices PA1, PA2, PA3, and PA4 so that the optical member 200 can cover the display devices PA1, PA2, PA3, and PA4.

The optical member 200 may include a plurality of first lenticular lenses 220 extending in the first direction (X-axis direction) and a plurality of second lenticular lenses 240 extending in the second direction (Y-axis direction). The first lenticular lenses 220 may extend in the first direction (X-axis direction) from one side extending in the second direction (Y-axis direction) of the display devices PA1, PA2, PA3, and PA4 to the other side that is opposite (or facing) the one side. The second lenticular lenses 240 may extend in the second direction (Y-axis direction) from one side extending in the first direction (X-axis direction) of the display devices PA1, PA2, PA3, and PA4 to the other side that is opposite (or facing) the one side.

The optical member 200 may include a plurality of first sub areas SA11 to SA19 extending in the first direction (X-axis direction) and spaced along the second direction (Y-axis direction). The first sub areas SA11 to SA19 may include a $(1\_1)^{th}$ sub area SA11, a $(1\_2)^{th}$ sub area SA12, a $(1\_3)^{th}$ sub area SA13, a $(1\_4)^{th}$ sub area SA14, a $(1\_5)^{th}$ sub area SA15, a $(1\_6)^{th}$ sub area SA16, a $(1\_7)^{th}$ sub area SA17, a $(1\_8)^{th}$ sub area SA18, and a $(1\_9)^{th}$ sub area SA19. In addition, the optical member 200 may include a plurality of second sub areas SA21 to SA29 extending in the second direction (Y-axis direction) and spaced along the first direction (X-axis direction). The second sub areas SA21 to SA29 may include a $(2\_1)^{th}$ sub area SA21, a $(2\_2)^{th}$ sub area SA22, a $(2\_3)^{th}$ sub area SA23, a $(2\_4)^{th}$ sub area SA24, a $(2\_5)^{th}$ sub area SA25, a $(2\_6)^{th}$ sub area SA26, a $(2\_7)^{th}$ sub area SA27, a $(2\_8)^{th}$ sub area SA28, and a $(2\_9)^{th}$ sub area SA29.

In an embodiment, the width-to-gap ratios of the first lenticular lenses 220 may gradually increase from 4:1 to 12:1 in units of first sub areas SA11 to SA19 from one side extending in the first direction (X-axis direction) toward the middle in each of the display devices PA1, PA2, PA3, and PA4.

For example, a first display device PA1 may include a first side XL1 extending in the first direction (X-axis direction) and a second side YL2 extending in the second direction (Y-axis direction) and may include a first center line CEX bisecting, in the first direction (X-axis direction), a width of the first display device PA1 in the second direction (Y-axis direction) and a second center line CEY bisecting, in the second direction (Y-axis direction), a width of the first display device PA1 in the first direction (X-axis direction).

The first lenticular lenses 220 may be disposed at intervals along the second direction (Y-axis direction) from the first side XL1 of the first display device PA1. The first lenticular lenses 220 may be disposed to correspond to each of the first sub areas SA11 to SA19. The first lenticular lenses 220 disposed in each of the first sub areas SA11 to SA19 may have the same width WW1 and may be spaced by the same gap GG1. For example, a plurality of first lenticular lenses 220 disposed in the $(1\_1)^{th}$ sub area SA11 may have the same width WW1 and may be spaced by the same gap GG1. Likewise, a plurality of first lenticular lenses 220 disposed in the $(1\_9)^{th}$ sub area SA19 may have the same width WW2 and may be spaced by the same gap GG1.

In an embodiment, the ratios of the widths of the first lenticular lenses 220 corresponding to the first display device PA1 to the gap between the first lenticular lenses 220 may gradually increase from 4:1 to 12:1 in units of first sub areas SA11 to SA19 from the first side XL1 of the first display device PA1 toward the first center line CEX.

For example, the ratio of the width of a first lenticular lens 220 to the gap between the first lenticular lenses 220 may be 4:1 in all of the first lenticular lenses 220 disposed in the $(1\_1)^{th}$ sub area SA11. In addition, the ratio of the width of the first lenticular lens 220 to the gap between the first lenticular lenses 220 may be 5:1 in all of the first lenticular lenses 220 disposed in the $(1\_2)^{th}$ sub area SA12. In this way, the ratio of the width of the first lenticular lens 220 to the gap between the first lenticular lenses 220 gradually increases toward the first center line CEX in units of first sub areas SA11 to SA19. In addition, the ratio of the width of the first lenticular lens 220 to the gap between the first lenticular lenses 220 may be 12:1 in all of the first lenticular lenses 220 disposed in the $(1\_9)^{th}$ sub area SA19 overlapping the first center line CEX.

In an embodiment, a minimum ratio of the width of the first lenticular lens 220 to the gap between the first lenticular lenses 220 may be 4:1, and a maximum ratio may be 12:1. The $(1\_1)^{th}$ sub area SA11 may overlap a boundary area BOA of a tiled display device TD. Because the ratio of the width of the first lenticular lens 220 to the gap between the first lenticular lenses 220 is a minimum ratio of 4:1 in the boundary area BOA, light diffusion characteristics in the boundary area BOA can be improved. The widths of the first lenticular lenses 220 may increase in an integer ratio, and the gap between the first lenticular lenses 220 may be the same in all of the first sub areas SA11 to SA19. However, the present disclosure is not limited thereto.

Likewise, the widths of the first lenticular lenses 220 may gradually increase in units of first sub areas SA11 to SA19 from a third side XL3 facing the first side XL1 of the first display device PA1 toward the first center line CEX. That is, the first sub areas SA11 to SA19 and the first lenticular lenses 220 corresponding to the first sub areas SA11 to SA19 may be symmetrical to each other with respect to the first center line CEX of the first display device PA1.

Because the ratio of the width of the first lenticular lens 220 to the gap between the first lenticular lenses 220 gradually increases from 4:1 to 12:1 in units of first sub areas SA11 to SA19 from the first side XL1 of the first display device PA1 toward the first center line CEX, the luminance of the boundary area BOA can be improved, and a reduction in the luminance of a display area DA can be prevented.

The tiled display device TD may improve the low luminance of the boundary area BOA by diffusing light of the display area DA. To this end, a first lenticular lens 220 adjacent to the first side XL1 overlapping the boundary area BOA of the first display device PA1 may be formed to have the smallest width, thereby increasing light diffusion characteristics. In addition, the tiled display device TD may prevent a reduction in the luminance of the display area DA due to diffusion of light. To this end, the widths of the first lenticular lenses 220 may be increased in units of first sub areas SA11 to SA19 as the distance to the first center line CEX of the first display device PA1 decreases. This may reduce the light diffusion characteristics, thereby preventing a reduction in luminance.

The first lenticular lenses 220 described above may extend not only on the first display device PA1 but also on a second display device PA2. Therefore, the first lenticular lenses 220 of the second display device PA2 may have the same structure as the first lenticular lenses 220 of the first display device PA1. In addition, the first lenticular lenses 220 of a third display device PA3 and a fourth display device PA4 may have the same structure as the first lenticular lenses 220 of the first display device PA1.

In an embodiment, the width-to-gap ratios of the second lenticular lenses 240 may gradually increase from 4:1 to 12:1 in units of second sub areas SA21 to SA29 from a side extending in the second direction (Y-axis direction) toward the middle in each of the display devices PA1, PA2, PA3, and PA4.

For example, in the first display device PA1, the second lenticular lenses 240 may be disposed at intervals along the first direction (X-axis direction) from the second side YL2 of the first display device PA1. The second lenticular lenses 240 may be disposed to correspond to each of the second sub areas SA21 to SA29. The second lenticular lenses 240 disposed in each of the second sub areas SA21 to SA29 may have the same width WW3 and may be spaced by the same gap GG1. For example, a plurality of second lenticular lenses 240 disposed in the $(2\_1)^{th}$ sub area SA21 may have the same width WW3 and may be spaced by the same gap GG1. Likewise, a plurality of second lenticular lenses 240 disposed in the $(2\_9)^{th}$ sub area SA29 may have the same width WW4 and may be spaced by the same gap GG1.

In an embodiment, the ratios of the widths of the second lenticular lenses 240 corresponding to the first display device PA1 to the gap between the second lenticular lenses 240 may gradually increase from 4:1 to 12:1 in units of second sub areas SA21 to SA29 from the second side YL2 of the first display device PA1 toward the second center line CEY.

For example, the ratio of the width of a second lenticular lens 240 to the gap between the second lenticular lenses 240 may be 4:1 in all of the second lenticular lenses 240 disposed in the $(2\_1)^{th}$ sub area SA21. In addition, the ratio of the width of the second lenticular lens 240 to the gap between the second lenticular lenses 240 may be 5:1 in all of the second lenticular lenses 240 disposed in the $(2\_2)^{th}$ sub area SA22. In this way, the ratio of the width of the second lenticular lens 240 to the gap between the second lenticular lenses 240 gradually increases toward the second center line CEY in units of second sub areas SA21 to SA29. In addition, the ratio of the width of the second lenticular lens 240 to the gap between the second lenticular lenses 240 may be 12:1 in all of the second lenticular lenses 240 disposed in the $(2\_9)^{th}$ sub area SA29 overlapping the second center line CEY.

In an embodiment, a minimum ratio of the width of the second lenticular lens 240 to the gap between the second lenticular lenses 240 may be 4:1, and a maximum ratio may be 12:1. The $(2\_1)^{th}$ sub area SA21 may overlap the boundary area BOA of the tiled display device TD. Because the ratio of the width of the second lenticular lens 240 to the gap between the second lenticular lenses 240 is a minimum ratio of 4:1 in the boundary area BOA, light diffusion characteristics in the boundary area BOA can be improved. The widths of the second lenticular lenses 240 may increase in an integer ratio, and the gap between the second lenticular lenses 240 may be the same in all of the second sub areas SA21 to SA29. However, the present disclosure is not limited thereto.

Likewise, the widths of the second lenticular lenses 240 may gradually increase in units of second sub areas SA21 to SA29 from a fourth side YL4 facing the second side YL2 of the first display device PA1 toward the second center line CEY. That is, the second sub areas SA21 to SA29 and the second lenticular lenses 240 corresponding to the second sub areas SA21 to SA29 may be symmetrical to each other with respect to the second center line CEY of the first display device PA1.

Because the ratio of the width of the second lenticular lens 240 to the gap between the second lenticular lenses 240 gradually increases from 4:1 to 12:1 in units of second sub areas SA21 to SA29 from the second side YL2 of the first display device PA1 toward the second center line CEY, the luminance of the boundary area BOA can be improved, and a reduction in the luminance of the display area DA can be prevented.

The tiled display device TD may improve the low luminance of the boundary area BOA by diffusing light of the display area DA. To this end, a second lenticular lens 240 adjacent to the fourth side YL4 overlapping the boundary area BOA of the first display device PA1 may be formed to have the smallest width, thereby increasing light diffusion characteristics. In addition, the tiled display device TD may prevent a reduction in the luminance of the display area DA due to diffusion of light. To this end, the widths of the second lenticular lenses 240 may be increased in units of second sub areas SA21 to SA29 as the distance to the second center line CEY of the first display device PA1 decreases. This may reduce the light diffusion characteristics, thereby preventing a reduction in luminance.

The second lenticular lenses 240 described above may extend not only on the first display device PA1 but also on the third display device PA3. Therefore, the second lenticular lenses 240 of the third display device PA3 may have the same structure as the second lenticular lenses 240 of the first display device PA1. In addition, the second lenticular lenses 240 of the second display device PA2 and the fourth display device PA4 may have the same structure as the second lenticular lenses 240 of the first display device PA1.

According to the above-described embodiments, a width-to-gap ratio of each of a plurality of first lenticular lenses 220 and a plurality of second lenticular lenses 240 may gradually increase from 4:1 to 12:1 from a side of each display device toward the middle. This can improve the luminance of a boundary area BOA between the display devices and prevent a reduction in front luminance of a display area DA. Accordingly, the problem of the boundary area between the display devices being recognized can be resolved, thereby eliminating a sense of separation between the display devices and improving the degree of immersion in images.

In a tiled display device according to described embodiments, a width-to-gap ratio of each of a plurality of first lenticular lenses and a plurality of second lenticular lenses may gradually increase from 4:1 to 12:1 from a side of each display device toward the middle. This can improve the luminance of a boundary area between the display devices and prevent a reduction in front luminance of a display area. Accordingly, the problem of the boundary area between the display devices being recognized can be resolved, thereby eliminating a sense of separation between the display devices and improving the degree of immersion in images.

In concluding the detailed description, those skilled in the art will appreciate that many variations and modifications can be made to the embodiments without substantially departing from the principles of the present disclosure. Therefore, the disclosed embodiments of the invention are used in a generic and descriptive sense only and not for purposes of limitation.

What is claimed is:

1. A tiled display device comprising:
a plurality of display devices, each of the plurality of display devices having a display area that is spaced from the display area of an adjacent one of the plurality of display devices by a single non-display area interposed therebetween; and
an optical member located at both the display area and the single non-display area,
wherein the optical member comprises:
a base substrate;
a plurality of first lenticular lenses located on a lower surface of the base substrate and extending in a first direction;
a plurality of second lenticular lenses located under the first lenticular lenses and extending in a second direction crossing the first direction, the single non-display area at least partially overlapping with two or more of the plurality of first lenticular lenses and two or more of the plurality of second lenticular lenses,
a plurality of first prism patterns on an upper surface of the base substrate and overlapping the single non-display area extending in the first direction; and
a plurality of second prism patterns on the plurality of first prism patterns and overlapping the single non-display area extending in the second direction,
wherein the plurality of second prism patterns cross the plurality of first prism patterns.

2. The tiled display device of claim 1, wherein in each of the display devices, a ratio of a width of one of the plurality of first lenticular lenses to a gap between adjacent ones of the plurality of first lenticular lenses increases from 4:1 to 12:1 from a first side of each of the display devices extending in the first direction toward a middle of each of the display devices in the second direction.

3. The tiled display device of claim 2, wherein in each of the display devices, a ratio of a width of one of the plurality of second lenticular lenses to a gap between adjacent ones of the plurality of second lenticular lenses increases from 4:1 to 12:1 from a second side of each of the display devices extending in the second direction toward a middle of each of the display devices in the first direction.

4. The tiled display device of claim 3, wherein widths of the plurality of first lenticular lenses and widths of the plurality of second lenticular lenses are variable, and the gap between adjacent ones of the plurality of first lenticular lenses and the gap between adjacent ones of the plurality of second lenticular lenses are the same.

5. The tiled display device of claim 1, wherein each of the display devices comprises the display area and the single non-display area surrounding the display area, the single non-display area comprising a boundary area that is adjacent to the non-display areas of adjacent ones of the plurality of display devices.

6. The tiled display device of claim 5, wherein the plurality of first lenticular lenses and the plurality of second lenticular lenses overlap the display area, the single non-display area, and the boundary area.

7. The tiled display device of claim 5, further comprising:
a first upper planarization layer on the first prism patterns,
wherein the plurality of second prism patterns are located on the first upper planarization layer and extending in the second direction.

8. The tiled display device of claim 7, wherein the plurality of first prism patterns overlap the boundary area extending in the first direction, and the plurality of second prism patterns overlap the boundary area extending in the second direction.

9. The tiled display device of claim 8, wherein the plurality of first prism patterns and the plurality of second prism patterns do not overlap the display areas of the plurality of display devices.

10. The tiled display device of claim 1, further comprising a second lower planarization layer located under the second lenticular lenses.

11. A tiled display device comprising:
a plurality of display devices, each of the plurality of display devices having a display area that is spaced from the display area of an adjacent one of the plurality of display devices by a single non-display area interposed therebetween; and
an optical member located at both the display area and the single non-display area,
wherein the optical member comprises:
a base substrate;
a plurality of first lenticular lenses located on a lower surface of the base substrate and extending in a first direction,
a plurality of second lenticular lenses located under the plurality of first lenticular lenses and extending in a second direction crossing the first direction,
a plurality of first prism patterns on an upper surface of the base substrate and overlapping the single non-display area extending in the first direction; and
a plurality of second prism patterns on the plurality of first prism patterns and overlapping the single non-display area extending in the second direction,
wherein the plurality of second prism patterns cross the plurality of first prism patterns, and
wherein in each of the display devices, a ratio of a width of one of the plurality of first lenticular lenses to a gap between adjacent ones of the plurality of first lenticular lenses increases from 4:1 to 12:1 from a first side of each of the display devices extending in the first direction toward a first center line passing through a center of each of the display devices in the first direction, the single non-display area at least partially overlapping with two or more of the plurality of first lenticular lenses and two or more of the plurality of second lenticular lenses.

12. The tiled display device of claim 11, further comprising:
a first lower planarization layer located under the plurality of first lenticular lenses,
wherein a ratio of a width of one of the plurality of second lenticular lenses to a gap between adjacent ones of the plurality of second lenticular lenses increases from 4:1 to 12:1 from a second side of each of the display devices extending in the second direction toward a second center line passing through the center of each of the display devices in the second direction.

13. The tiled display device of claim 12, wherein each of the display devices comprises the display area and the single non-display area surrounding the display area, the single non-display area comprising a boundary area that is adjacent to the non-display areas of adjacent ones of the plurality of display devices.

14. The tiled display device of claim 13, wherein the plurality of first lenticular lenses and the plurality of second lenticular lenses overlap the display area, the single non-display area, and the boundary area.

15. The tiled display device of claim 13, further comprising:
a first upper planarization layer located on the first prism patterns,
wherein the plurality of second prism patterns are located on the first upper planarization layer and extending in the second direction.

16. A tiled display device comprising:
a plurality of display devices, each of the plurality of display devices having a display area that is spaced from the display area of an adjacent one of the plurality of display devices by a single non-display area interposed therebetween; and
an optical member located at both the display area and the single non-display area and comprising a plurality of first sub areas extending in a first direction and spaced from each other along a second direction crossing the first direction and a plurality of second sub areas extending in the second direction and spaced from each other along the first direction,
wherein the optical member comprises:
a base substrate;
a plurality of first lenticular lenses located on a lower surface of the base substrate and extending in the first direction,
a plurality of second lenticular lenses located under the plurality of first lenticular lenses and extending in the second direction crossing the first direction,
a plurality of first prism patterns on an upper surface of the base substrate and overlapping the single non-display area extending in the first direction; and
a plurality of second prism patterns on the plurality of first prism patterns and overlapping the single non-display area extending in the second direction,
wherein the plurality of second prism patterns cross the plurality of first prism patterns, and
wherein a ratio of a width of one of the plurality of first lenticular lenses to a gap between adjacent ones of the plurality of first lenticular lenses increases from 4:1 to 12:1 from a first side of each of the display devices extending in the first direction toward a first center line passing through a center of each of the display devices in the first direction, and ratios of widths of the plurality of first lenticular lenses disposed in a same first sub area from among the plurality of first sub areas to the gap between adjacent ones of the plurality of first lenticular lenses are the same, the single non-display area at least partially overlapping with two or more of the plurality of first lenticular lenses and two or more of the plurality of second lenticular lenses.

17. The tiled display device of claim 16, further comprising:
a first lower planarization layer located under the plurality of first lenticular lenses,
wherein a ratio of a width of one of the plurality of second lenticular lenses to a gap between adjacent ones of the plurality of second lenticular lenses increases from 4:1 to 12:1 from a second side of each of the display devices extending in the second direction toward a second center line passing through the center of each of the display devices in the second direction, and ratios of widths of one of the plurality of second lenticular lenses located in a same second sub area from among the plurality of second sub areas to the gap between adjacent ones of the plurality of second lenticular lenses are the same.

18. The tiled display device of claim 17, wherein each of the plurality of display devices comprises the display area and the single non-display area surrounding the display area, the single non-display area comprising a boundary area that is adjacent to the non-display areas of adjacent ones of the plurality of display devices, and the plurality of first lenticular lenses and the plurality of second lenticular lenses overlap the display area, the single non-display area, and the boundary area.

19. The tiled display device of claim 18, further comprising:
   a first upper planarization layer located on the first prism patterns,
   wherein the plurality of second prism patterns are located on the first upper planarization layer and extending in the second direction.

20. The tiled display device of claim 19, further comprising a second lower planarization layer located under the plurality of second lenticular lenses.

\* \* \* \* \*